(12) United States Patent
Zhao et al.

(10) Patent No.: US 12,137,597 B2
(45) Date of Patent: Nov. 5, 2024

(54) DISPLAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Yu Zhao, Beijing (CN); Yong Zhuo, Beijing (CN); Wei He, Beijing (CN); Yanxia Xin, Beijing (CN); Qun Ma, Beijing (CN); Xiping Li, Beijing (CN); Jianpeng Liu, Beijing (CN); Kui Fang, Beijing (CN); Cheng Tan, Beijing (CN); Xueping Li, Beijing (CN); Yihao Wu, Beijing (CN); Xiaoyun Wang, Beijing (CN); Haibo Li, Beijing (CN); Xiaoyan Yang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/270,955

(22) PCT Filed: Aug. 23, 2022

(86) PCT No.: PCT/CN2022/114332
§ 371 (c)(1),
(2) Date: Jul. 5, 2023

(87) PCT Pub. No.: WO2023/045678
PCT Pub. Date: Mar. 30, 2023

(65) Prior Publication Data
US 2024/0074282 A1 Feb. 29, 2024

(30) Foreign Application Priority Data

Sep. 27, 2021 (CN) .......................... 202111137439.5

(51) Int. Cl.
*G06F 3/041* (2006.01)
*G06F 3/044* (2006.01)
(Continued)

(52) U.S. Cl.
CPC ........... *H10K 59/40* (2023.02); *G06F 3/0445* (2019.05); *H10K 59/131* (2023.02);
(Continued)

(58) Field of Classification Search
None
See application file for complete search history.

(56) References Cited

U.S. PATENT DOCUMENTS

2019/0036073 A1\* 1/2019 Yu ......................... G06F 3/0443
2021/0013270 A1 1/2021 Yu et al.
(Continued)

FOREIGN PATENT DOCUMENTS

CN 107845645 A 3/2018
CN 108766994 A 11/2018
(Continued)

*Primary Examiner* — Brian M Butcher
(74) *Attorney, Agent, or Firm* — WHDA, LLP

(57) ABSTRACT

The present application provides a displaying base plate and a displaying device, which relates to the technical field of displaying. The displaying device can ameliorate the problem of screen greening caused by electrostatic charges, thereby improving the effect of displaying. The displaying base plate includes an active area and a non-active area connected to the active area, the non-active area includes an edge region and a first-dam region, and the first-dam region is located between the active area and the edge region; the displaying base plate further includes: a substrate; an anti-static layer disposed on the substrate, wherein the anti-static layer is located at least within the edge region; and a driving unit and a touch unit that are disposed on the substrate, wherein the driving unit is located within the active area.

19 Claims, 14 Drawing Sheets

(51) Int. Cl.
*H10K 59/131* (2023.01)
*H10K 59/40* (2023.01)
*H10K 59/80* (2023.01)

(52) U.S. Cl.
CPC .. *H10K 59/874* (2023.02); *G06F 2203/04111* (2013.01); *G06F 2203/04112* (2013.01)

(56) References Cited

U.S. PATENT DOCUMENTS

2021/0210713 A1 7/2021 Li et al.
2021/0359069 A1 11/2021 Wang et al.

FOREIGN PATENT DOCUMENTS

| CN | 110233161 A | 9/2019 |
| CN | 216389370 U | 4/2022 |

* cited by examiner

DISPLAY SUBSTRATE AND DISPLAY APPARATUS

CROSS REFERENCE TO RELEVANT APPLICATIONS

The present application claims the priority of the Chinese patent application filed on Sep. 27, 2021 before the Chinese Patent Office with the application number of 202111137439.5 and the title of "DISPLAY SUBSTRATE AND DISPLAY APPARATUS", which is incorporated herein in its entirety by reference.

TECHNICAL FIELD

The present application relates to the technical field of displaying and, more particularly, to a displaying base plate and a displaying device.

BACKGROUND

After a finger of the user continuously slides on an organic light emitting diode (OLED) touch screen for a duration, the screen surface contacting with the finger may generate a large quantity of electrostatic charges. The OLED touch screen includes an insulating layer. The insulating layer contains a large quantity of organic polymerized molecules, and therefore the electrostatic charges accumulate and have a polarization reaction, which causes that some of the electric charges are conducted into the driving back plate, which finally causes that the characteristic of the thin-film transistors (TFT) of the driving back plate deviates, and the edge of the screen has greening, thereby the effect of displaying is deteriorated.

SUMMARY

The embodiments of the present application provide a displaying base plate and a displaying device. The displaying device can ameliorate the problem of screen greening caused by electrostatic charges, thereby the effect of displaying is improved.

In order to achieve the above object, the embodiments of the present application employ the following technical solutions:

In an aspect, there is provided a displaying base plate, wherein the displaying base plate includes an active area and a non-active area connected to the active area, the non-active area includes an edge region and a first-dam region, and the first-dam region is located between the active area and the edge region;

the displaying base plate further includes:
a substrate;
an anti-static layer disposed on the substrate, wherein the anti-static layer is located at least within the edge region; and
a driving unit and a touch unit that are disposed on the substrate, wherein the driving unit is located within the active area, and the touch unit is located within the active area and the non-active area, and covers the driving unit; and
the anti-static layer and the touch unit are arranged in a same one layer, or the anti-static layer is disposed at one side of the touch unit away from the substrate.

Optionally, the touch unit includes a first touch layer, a first insulating layer, a second touch layer and a second insulating layer that are arranged sequentially in layer configuration on the driving unit; both of the first touch layer and the second touch layer are located within the active area, and the first insulating layer and the second insulating layer are located within the active area and the non-active area; and
one of the first touch layer and the second touch layer is a metal-mesh electrode layer, and the other is a bridging metal layer.

Optionally, when the anti-static layer and the touch unit are arranged in a same one layer, the anti-static layer and the first touch layer are arranged in a same one layer; or
when the anti-static layer and the touch unit are arranged in a same one layer, the anti-static layer and the second touch layer are arranged in a same one layer.

Optionally, the second insulating layer covers the first insulating layer, and a boundary of the second insulating layer is further from the first-dam region than a boundary of the first insulating layer; and
the second insulating layer located within the non-active area is disposed at one side of the anti-static layer away from the substrate.

Optionally, an orthographic projection of the anti-static layer on the substrate and an orthographic projection of the second insulating layer on the substrate partially intersect or overlap; or
an orthographic projection of the anti-static layer on the substrate is located within an orthographic projection of the second insulating layer on the substrate.

Optionally, when the anti-static layer is disposed on the one side of the touch unit away from the substrate, the second insulating layer located within the non-active area is disposed at one side of the anti-static layer that is closer to the substrate.

Optionally, the first-dam region surrounds the active area, and the edge region surrounds the first-dam region.

Optionally, the edge region includes a cutting-transition region, a crack-dam region and a driving-circuit region; the crack-dam region surrounds the first-dam region, and is broken at the driving-circuit region; and the cutting-transition region surrounds the crack-dam region and the driving-circuit region; and
the crack-dam region includes one or more slots, and the slots surround the first-dam region, and is broken at the driving-circuit region; and the anti-static layer covers at least some of the slots.

Optionally, the displaying base plate further includes a buffer layer, a gate insulating layer and an inter-layer-medium layer that are arranged sequentially in layer configuration; and all of the inter-layer-medium layer, the gate insulating layer and the buffer layer are located within the active area, the first-dam region and the crack-dam region; and
the slots extend throughout at least a part of the inter-layer-medium layer that is located within the crack-dam region.

Optionally, the displaying base plate further includes a first planarization part and a first protrusion, and the first planarization part is located within the cutting-transition region and the crack-dam region; the first protrusion is located within the crack-dam region, surrounds the first-dam region, and is broken at the driving-circuit region; and
the first planarization part covers all of the slots, the first protrusion is disposed at one side of the first planarization part away from the substrate, and the anti-static layer covers the first protrusion.

Optionally, an edge closer to the cutting-transition region of an entirety formed by the inter-layer-medium layer, the gate insulating layer and the buffer layer has one or more steps; and the first planarization part covers all of the steps.

Optionally, the edge region further includes a crack detecting region, and the crack detecting region is located between the first-dam region and the crack-dam region; and
the crack detecting region includes a plurality of crack detecting lines, and the anti-static layer covers all of the crack detecting lines and all of the slots.

Optionally, the anti-static layer is further located within the first-dam region;
the non-active area further includes a wiring region, and the wiring region is located between the first-dam region and the active area;
the displaying base plate further includes a power-supply signal line, and the power-supply signal line is located within the wiring region and the first-dam region; and the power-supply signal line and the anti-static layer partially intersect or overlap in a direction perpendicular to the substrate.

Optionally, all of the inter-layer-medium layer, the gate insulating layer and the buffer layer are further located within the wiring region and the crack detecting region;
the first-dam region includes at least one first dam, and the first dam is disposed at one side of the inter-layer-medium layer away from the substrate; the first dam includes a second protrusion, a second planarization part and a third planarization part that are sequentially arranged; the second planarization part coats the second protrusion, and the third planarization part coats the second planarization part;
wherein the second protrusion and the first planarization part are arranged in a same one layer, and the second planarization part and the first protrusion are arranged in a same one layer.

Optionally, the first-dam region further includes a jumper wire and a third protrusion, the third protrusion is disposed at one side of the first dam closest to the cutting-transition region that is closer to the crack-dam region, the jumper wire is disposed on the one side of the inter-layer-medium layer away from the substrate, the third protrusion coats the jumper wire, and the third protrusion, the second protrusion and the first planarization part are arranged in a same one layer.

Optionally, the power-supply signal line includes at least a first power line, and the first power line is disposed on the one side of the inter-layer-medium layer away from the substrate; and the first dam is disposed at one side of the first power line away from the substrate;
the first power line and the jumper wire are arranged in a same one layer, and are disconnected from each other, and the third protrusion further coats an edge of the first power line that is closer to the cutting-transition region; and
the first power line and the anti-static layer partially intersect or overlap in the direction perpendicular to the substrate.

Optionally, the power-supply signal line further includes a second power line and a third power line; the third power line is disposed at one side of the second power line away from the substrate; and
an edge of the second power line that is closer to the cutting-transition region is disposed between the second protrusion and the second planarization part of the first dam closest to the cutting-transition region, and an edge of the third power line that is closer to the cutting-transition region is disposed between the second planarization part and the third planarization part of the first dam closest to the cutting-transition region.

Optionally, the displaying base plate further includes a plurality of light emitting units arranged in an array; and the light emitting units are located within the active area, and are disposed between the driving unit and the touch unit;
each of the light emitting units includes a first electrode, a luminescent functional layer and a second electrode; and the second electrode is disposed at one side of the luminescent functional layer away from the driving unit;
the driving unit includes a plurality of transistors arranged in an array, a first planarization film, a plurality of switching electrodes and a second planarization film, the first planarization film covers the transistors, and the switching electrodes are disposed between the first planarization film and the second planarization film, and are electrically connected to the transistors; the first electrode is disposed at one side of the second planarization film away from the substrate, and is electrically connected to one of the switching electrodes;
wherein the first power line is disposed in a same layer as a source and a drain of each of the transistors; the second power line is disposed in a same layer as the switching electrode; the third power line and the first electrode are arranged in a same one layer; the first planarization film, the first planarization part, the second protrusion and the third protrusion are arranged in a same one layer; and the second planarization film, the second planarization part and the first protrusion are arranged in a same one layer.

Optionally, the edge region includes an opening region and a transition region; the transition region surrounds the opening region, and the first-dam region surrounds the transition region; and
the anti-static layer is located at least within the transition region.

Optionally, the transition region includes at least one second dam, and the second dam is disposed at one side of the anti-static layer that is closer to the substrate, and at least partially intersects or overlaps with the anti-static layer in a direction perpendicular to the substrate.

Optionally, the first-dam region includes at least one third dam, and the third dam and the second dam are arranged in a same one layer; and
the anti-static layer and the third dam do not intersect or overlap in the direction perpendicular to the substrate.

Optionally, the transition region further includes a blocking wall, and the blocking wall is located between the second dam and the third dam, and surrounds the second dam.

Optionally, the non-active area further includes an isolating region, and the isolating region is located between the first-dam region and the active area, and surrounds the first-dam region; and
the isolating region includes an isolating pillar, and the isolating pillar surrounds the first-dam region.

Optionally, the non-active area further includes a trace region, and the trace region is located between the isolating region and the active area, and surrounds the isolating region; and
the trace region includes a plurality of traces, and the traces of the trace region are electrically connected to the traces corresponding to the active area.

Optionally, the displaying base plate further includes a buffer layer, a gate insulating layer and an inter-layer-medium layer that are arranged sequentially in layer configuration; all of the inter-layer-medium layer, the gate insulating layer and the buffer layer are located within the active area, the trace region, the isolating region, the first-dam region and the transition region; and all of the second dam, the third dam and the isolating pillar are disposed at one side of the inter-layer-medium layer away from the substrate.

Optionally, the displaying base plate further includes a packaging unit, and a plurality of light emitting units arranged in an array; the packaging unit covers the light emitting units, and is disposed between the light emitting units and the touch unit; the packaging unit is located within the non-active area and the active area, and the light emitting units are located within the active area;

wherein the packaging layer includes a first inorganic packaging layer, an organic packaging layer and a second inorganic packaging layer that are arranged sequentially in layer configuration; the first inorganic packaging layer and the second inorganic packaging layer are configured to package the first-dam region and the light emitting units; and the organic packaging layer is configured to package the light emitting units, and is broken within the first-dam region.

In another aspect, an embodiment of the present application further provides a displaying device, wherein the displaying device includes the displaying base plate stated above.

Optionally, the displaying device further includes a packaging base plate, and the packaging base plate and the displaying base plate are fixed together by a binding layer.

The above description is merely a summary of the technical solutions of the present application. In order to more clearly know the elements of the present application to enable the implementation according to the contents of the description, and in order to make the above and other purposes, features and advantages of the present application more apparent and understandable, the particular embodiments of the present application are provided below.

BRIEF DESCRIPTION OF THE DRAWINGS

In order to more clearly illustrate the technical solutions of the embodiments of the present application or the prior art, the figures that are required to describe the embodiments or the prior art will be briefly described below. Apparently, the figures that are described below are merely embodiments of the present application, and a person skilled in the art can obtain other figures according to these figures without paying creative work.

DETAILED DESCRIPTION

Figure 1:
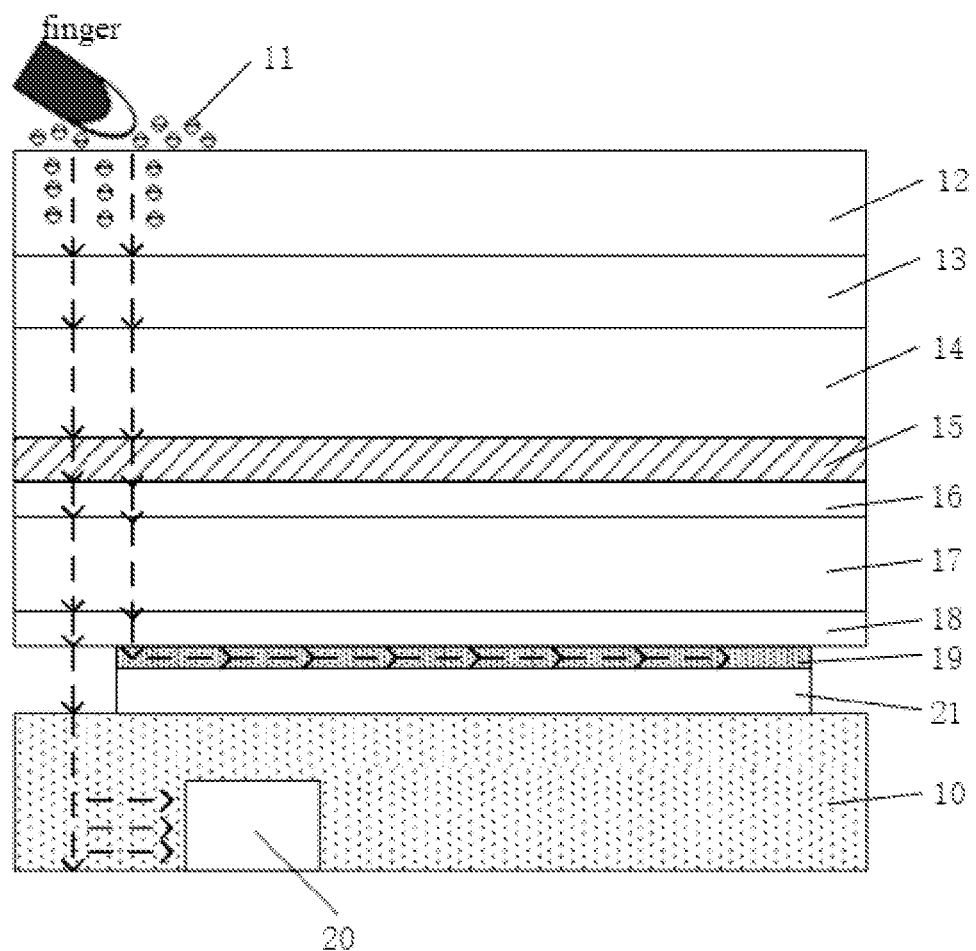
FIG. 1 is a schematic structural diagram of a displaying device according to an embodiment of the present application.

The technical solutions of the embodiments of the present application will be clearly and completely described below with reference to the drawings of the embodiments of the present application. Apparently, the described embodiments are merely certain embodiments of the present application, rather than all of the embodiments. All of the other embodiments that a person skilled in the art obtains on the basis of the embodiments of the present application without paying creative work fall within the protection scope of the present application.

In the embodiments of the present application, terms such as "first" and "second" are used to distinguish identical items or similar items that have substantially the same functions and effects, merely in order to clearly describe the technical solutions of the embodiments of the present application, and should not be construed as indicating or implying the degrees of importance or implicitly indicating the quantity of the specified technical features.

In the embodiments of the present application, the meaning of "plurality of" is "two or more", and the meaning of "at least one" is "one or more", unless explicitly and particularly defined otherwise.

In the embodiments of the present application, the terms that indicate orientation or position relations, such as "upper" and "lower", are based on the orientation or position relations shown in the drawings, and are merely for conveniently describing the present application and simplifying the description, rather than indicating or implying that the device or element must have the specific orientation and be constructed and operated according to the specific orientation. Therefore, they should not be construed as a limitation on the present application.

Referring to FIG. 1, after a finger of the user continuously slides on an OLED touch screen for a duration, the screen surface contacting with the finger generates a large quantity of electrostatic charges 11. Because the glass cover plate 12, the optically clear adhesive (OCA) layer 13 and the polarize (POL) layer 14 contain a large quantity of organic polymerized molecules, the electrostatic charges accumulate and have a polarization reaction, which causes the electric charges to, in the direction shown in FIG. 1 (represented by the arrowed dotted line), sequentially pass through the touch layer 15, the second CVD layer 16, the ink jet printing (IJP) layer 17 and the first CVD layer 18 and be conducted to the driving back plate 11. When the electric charges 11 are conducted to the CTD layer 19 in the direction shown in FIG. 1, some of the electric charges are released by the CTD layer, and the other electric charges are conducted from the edge of the CTD layer 19 to the driving back plate 10, which finally causes that the characteristic of the thin-film transistors (TFT) 20 of the driving back plate 10 deviates, and the edge of the screen has greening, thereby deteriorating the effect of displaying. In FIG. 1, the organic luminescent layer (EL) is marked as 21.

On the basis of the above, an embodiment of the present application provides a displaying base plate, wherein the displaying base plate includes an active area and a non-active area connected to the active area, the non-active area includes an edge region and a first-dam region, and the first-dam region is located between the active area and the edge region.

The active area refers to the region used to realize the displaying. The non-active area is generally used to dispose the driving traces and the driving circuits, for example, a gate driver on array (GOA) driving circuit, or used to dispose an in-screen camera, an earphone, a loudspeaker and so on. The non-active area may include merely one region. As an example, the non-active area may include merely the region A0 shown in FIG. 2a, the region A0 includes an edge region A3 and a first-dam region A2, the first-dam region A2 surrounds the active area A1, and the edge region A3 surrounds the first-dam region A2. Alternatively, the non-active area may also include merely the region B0 shown in FIG. 2a, the region B0 includes an edge region B6 and a first-dam region B2, the edge region B6 includes an opening region B1 and a transition region B3, the transition region B3 surrounds the opening region B1, and the first-dam region B2 surrounds the transition region B3. Certainly, the non-active area may also include two independent regions at the same time. As an example, the non-active area may include the region A0 and the region B0 shown in FIG. 2a at the same time, which is not limited in the present application. It should be noted that, in order to facilitate to clearly describe subsequently, the region A0 may be referred to as the first non-active area, and the region B0 may be referred to as the second non-active area.

Figure 2A:
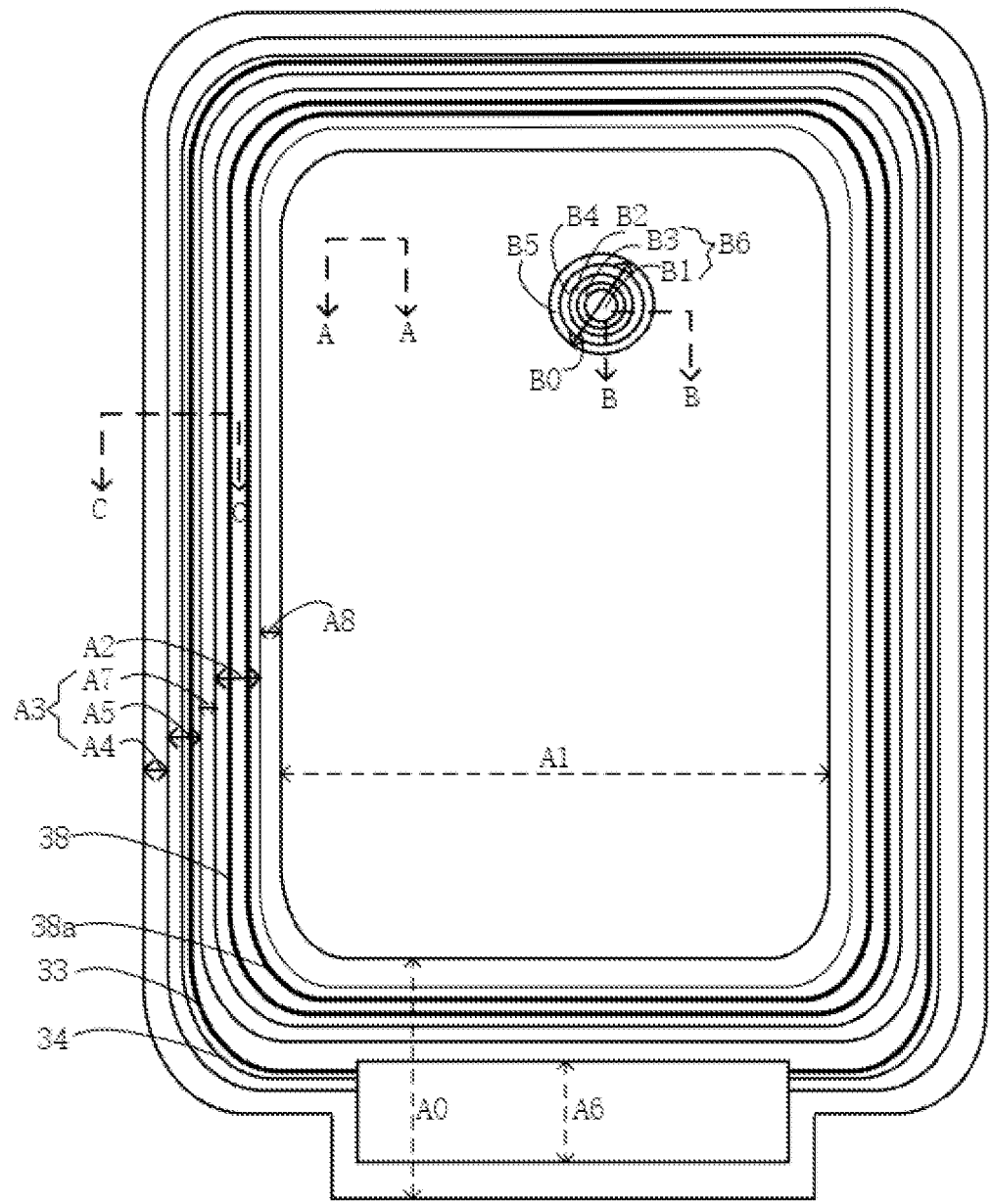
FIG. 2*a* and FIG. 2*b* are two top views of a displaying base plate according to an embodiment of the present application.

The first-dam region may include at least one dam (also referred to as DAM), which is used to solve the problem of water-oxygen invasion caused by ink overflowing when an organic packaging layer is formed by ink-jet printing. The quantity of the dam is not limited. FIG. 2a illustrates by taking the case as an example in which the first-dam region A2 within the first non-active area A0 includes two dams (marked as 38a and 38 in FIG. 2a). The dam may surround the active area by one ring, as shown in FIG. 2a, and may also surround a part of the active area, which is not limited herein. In order to realize a better effect of the packaging, the former is preferable. The dam may be of the structure of one layer or multiple layers, which is not limited herein.

Figure 2B:
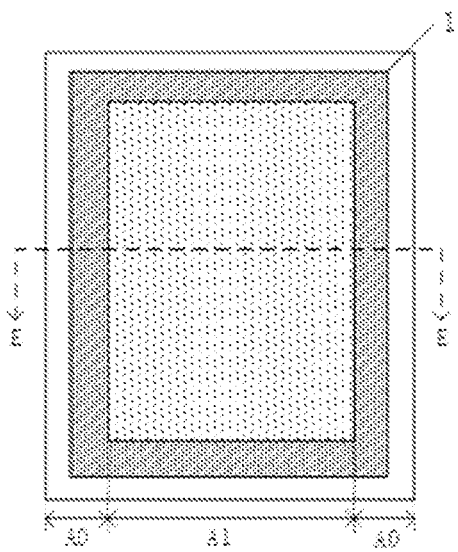
Figure 3:
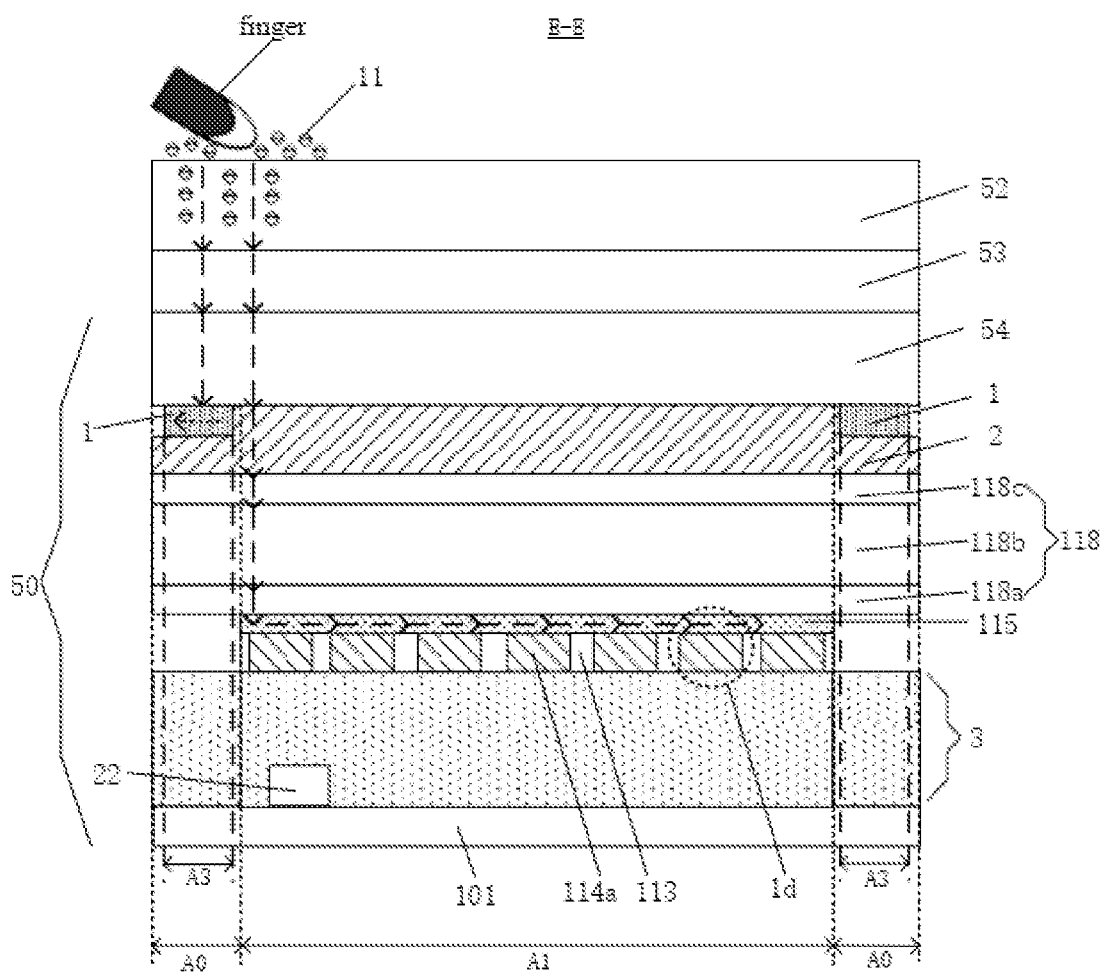
FIG. 3 and FIG. 4 are two cross-sectional views along an EE direction in FIG. 2*b*.
Figure 4:
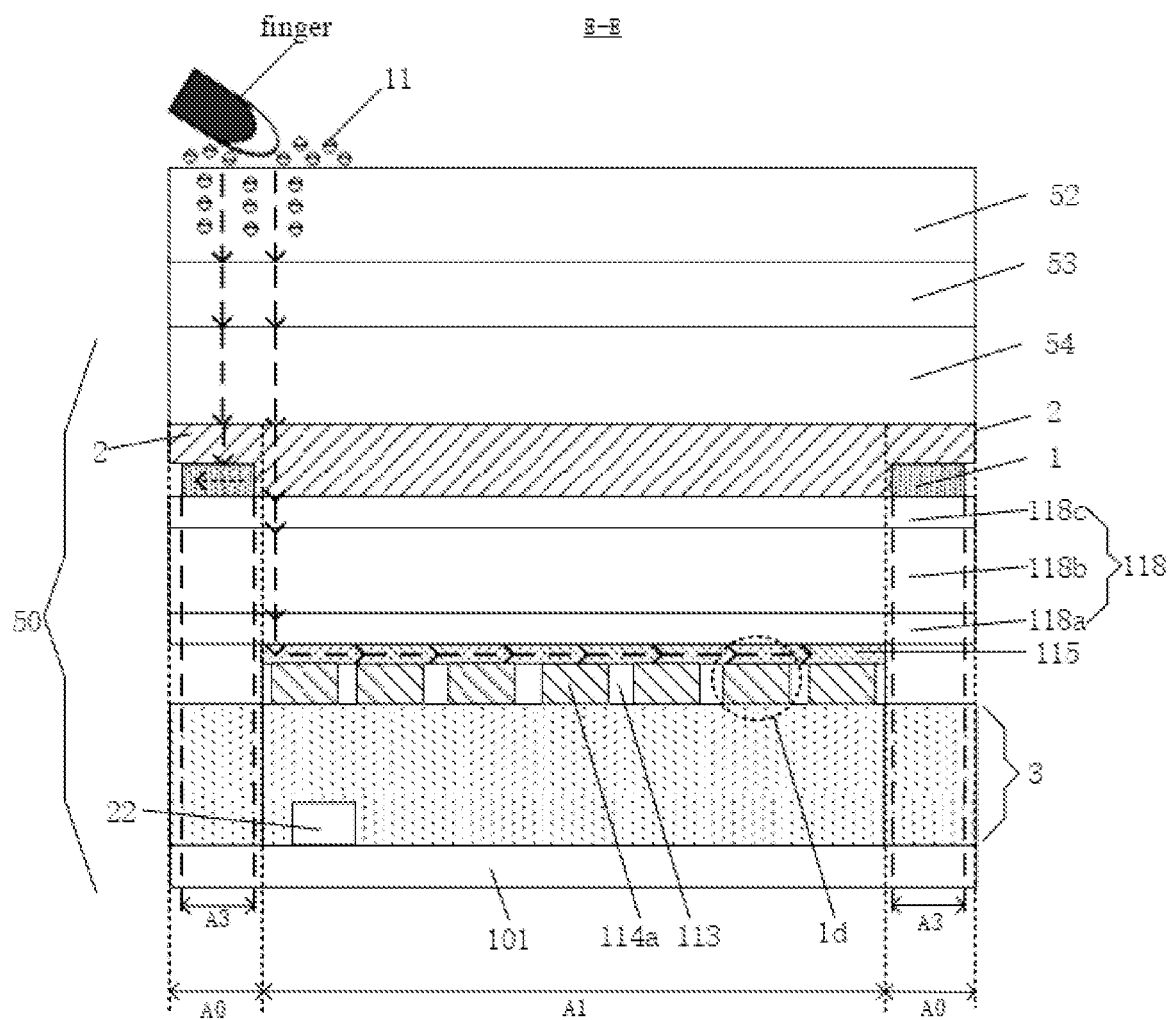

Referring to FIGS. 2b, 3 and 4, the displaying base plate further includes:

a substrate 101, wherein the material of the substrate is not limited, and as an example, it may be a rigid material such as a glass, and may also be a flexible material such as PI (polyimide);

an anti-static layer 1 disposed on the substrate 101, wherein the anti-static layer 1 is located at least within the edge region (the region A3 within the first non-active area A0 in FIGS. 3 and 4); and a driving unit 3 and a touch unit 2 that are disposed on the substrate 101, wherein the driving unit 3 is located within the active area A1, and the touch unit 2 is located within the active area A1 and the non-active area (the first non-active area A0 in FIGS. 3 and 4), and covers the driving unit 3.

Referring to FIG. 4, the anti-static layer 1 and the touch unit 2 are arranged in a same one layer, or, referring to FIG. 3, the anti-static layer 1 is disposed at the side of the touch unit 2 away from the substrate 101.

It should be noted that FIGS. 3 and 4 illustrate by taking the case as an example in which the anti-static layer 1 is disposed within the edge region A3 of the first non-active area A0. The anti-static layer 1 may be an annular metal layer, as shown in FIG. 2b, and the annular shape may be a round ring, a rectangular ring or an irregular annular shape, which is not limited herein. The material of the anti-static layer may include a metal or a metal oxide. As an example, the material of the anti-static layer may include a metal such as silver, molybdenum, aluminum and titanium, and may also include a metal oxide such as indium tin oxide (ITO).

Referring to FIGS. 3 and 4, the displaying base plate may further include a plurality of light emitting units 1d arranged in an array. The light emitting units 1d are located within the active area A1, and are disposed between the driving unit 3 and the touch unit 2. The driving unit may include a plurality of driving circuits, and the driving circuits are used to supply driving currents to the corresponding light emitting units, to cause the light emitting units to emit light. Referring to FIGS. 3 and 4, each of the driving circuits may include at least one transistor 22. The transistors may be polycrystalline-silicon transistors, for example, low-temperature polycrystalline silicon (LTPS) transistors, or oxide transistors, for example, indium gallium zinc oxide (IGZO) transistors, which is not limited herein.

The structure of the touch unit is not limited. As an example, the touch unit may employ a mutual-capacitance-type touch structure, or a self-capacitance-type touch structure. The mutual-capacitance-type touch structure or self-capacitance-type touch structure may be obtained according to the related art, and is not described in detail herein.

The above-described arrangement in a same layer refers to that they are fabricated by using a one-step patterning process. The one-step patterning process refers to a process in which the required layer structure is formed by a single exposure. The one-step patterning process includes the processes of masking, exposure, development, etching, stripping and so on.

The anti-static layer may be disposed in the same layer as the touch unit. Accordingly, the anti-static layer is formed simultaneously with the formation of the touch unit, which can reduce the time quantity of the patterning processes, to reduce the cost. Alternatively, the anti-static layer may also be disposed at the side of the touch unit away from the substrate; in other words, the touch unit may be formed firstly, and subsequently the anti-static layer is formed. In this way, protruding of the edge film layers of the touch unit may be prevented, thereby their peeling is prevented, the performance of the displaying base plate is improved.

In the displaying base plate according to the embodiments of the present application, by disposing the anti-static layer to block and release the electrostatic charges generated by the friction of the finger on the screen surface, the electric charges that are conducted from the non-active area to the driving unit are highly reduced, thereby the probability that the transistors of the driving unit have characteristic deviation is greatly reduced and the problem of greening of the edge region may be finally ameliorated, so as to improve the effect of displaying. Taking the structures shown in FIGS. 3 and 4 as an example for the particular description, referring to FIGS. 3 and 4, when the electrostatic charges 11 generated by the friction of the finger on the screen surface have been conducted to the anti-static layer 1, the anti-static layer 1 can serve to block and release the electric charges, and therefore the electric charges that are conducted from the non-active area to the driving unit are highly reduced, thereby greatly reducing the probability that the transistors of the driving unit have characteristic deviation, so as to the effect of displaying is finally improved.

Figure 5:
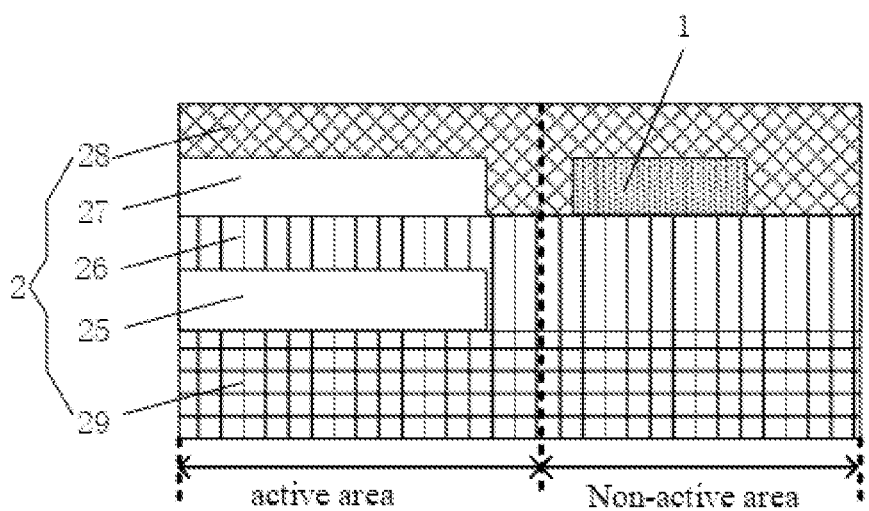
FIG. 5 and FIG. 6 are two schematic structural diagrams of the touch unit and the anti-static layer according to the embodiments of the present application.
Figure 6:
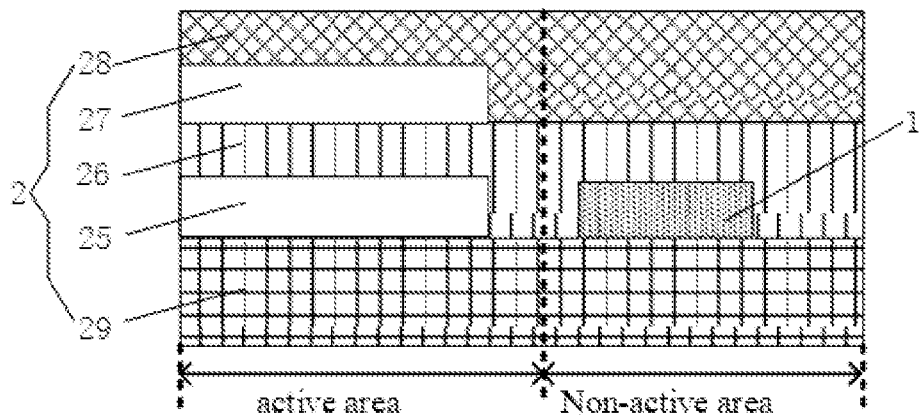

In one or more embodiments, referring to FIGS. 5 and 6, the touch unit 2 includes a first touch layer 25, a first insulating layer 26, a second touch layer 27 and a second insulating layer 28 that are arranged sequentially in layer configuration on the driving unit. Both of the first touch layer 25 and the second touch layer 27 are located within the active area, and the first insulating layer 26 and the second insulating layer 28 are located within the active area and the non-active area. One of the first touch layer and the second touch layer is a metal-mesh electrode layer, and the other is a bridging metal layer.

The first touch layer may be the metal-mesh electrode layer, and at the same time the second touch layer may be the bridging metal layer. Alternatively, the first touch layer may be the bridging metal layer, and at the same time the second touch layer may be the metal-mesh electrode layer. In order to obtain a better effect of the touch controlling, the latter may be selected.

Figure 7:
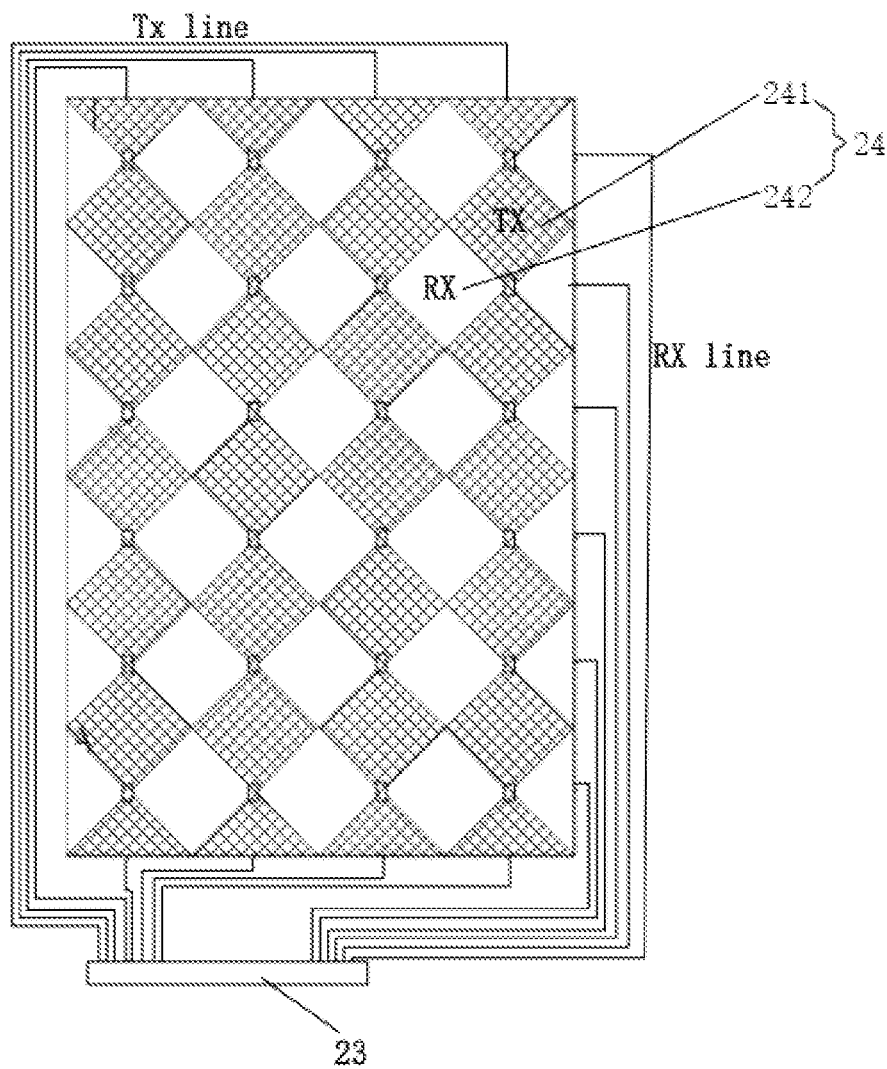
FIG. 7 is a schematic structural diagram of a touch unit according to an embodiment of the present application.

Referring to FIG. 7, the metal-mesh electrode layer 24 may include driving electrodes (TX electrodes) 241 and sensing electrodes (RX electrodes) 242. The driving electrodes 241 in each of the columns are directly connected, and are electrically connected to a touch driving unit 23 by the TX lines. The sensing electrodes 242 in each of the rows are electrically connected to the bridging metal layer by via holes extending throughout the first insulating layer, and are electrically connected to the touch driving unit 23 by RX lines. The metal-mesh electrode layer 24 may be located within the active area, and the TX lines, the RX lines and the touch driving unit may be located within the non-active area. The structure of the touch unit is the flexible multi-layer on cell (FMLOC) touch structure. That touch structure can reduce the screen thickness, which facilitates folding; and the touch structure has no adhering tolerance at the same time, which can reduce the width of the border frame; in addition, the touch structure can reduce the risk in cracking.

The material of the first insulating layer and the second insulating layer may be any one of silicon nitride, silicon oxide and silicon oxynitride.

In order to better form the first touch layer, the touch unit may further include an isolating layer 29 shown in FIGS. 5 and 6, and the isolating layer 29 is disposed at the side of the first touch layer 25 away from the first insulating layer 26.

Optionally, in order to simplify the process, and reduce the difficulty in the fabrication, if the anti-static layer and the touch unit are arranged in the same one layer, referring to FIG. 6, the anti-static layer 1 and the first touch layer 25 are arranged in the same one layer; in other words, the anti-static layer and the first touch layer can be simultaneously formed by using a one-step patterning process.

Alternatively, if the anti-static layer and the touch unit are arranged in the same one layer, referring to FIG. 5, the anti-static layer 1 and the second touch layer 27 are arranged in the same one layer; in other words, the anti-static layer and the second touch layer can be simultaneously formed by using a one-step patterning process.

Further optionally, referring to FIGS. 8-11, the second insulating layer 28 covers the first insulating layer 27, and the boundary of the second insulating layer 28 is further from the first-dam region than the boundary of the first insulating layer 27. The second insulating layer 28 located within the non-active area is disposed at the side of the anti-static layer 1 away from the substrate 101.

Figure 8:
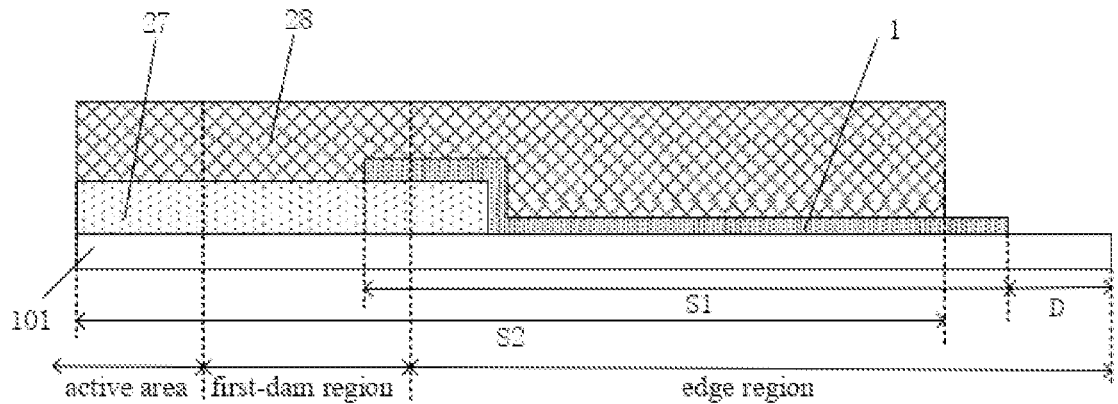
FIGS. 8-12 are multiple schematic diagrams showing the position relations among the first insulating layer, the second insulating layer and the anti-static layer according to the embodiments of the present application.
Figure 9:
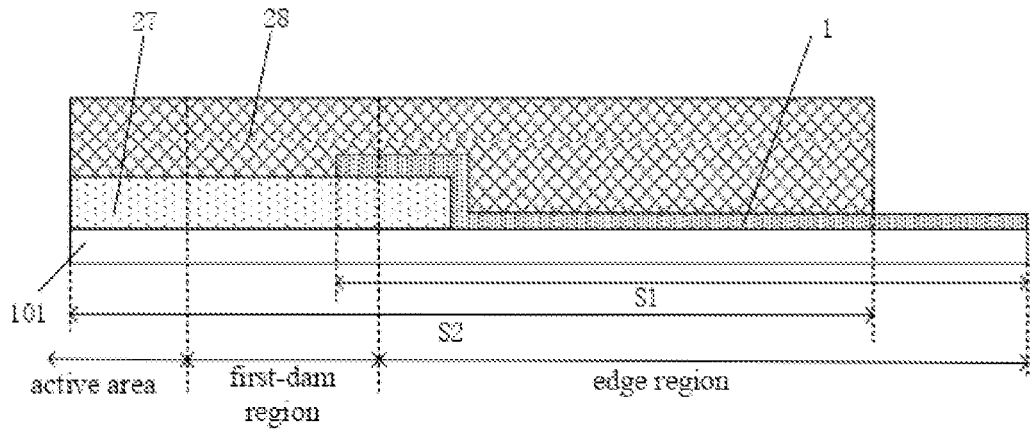
Figure 10:
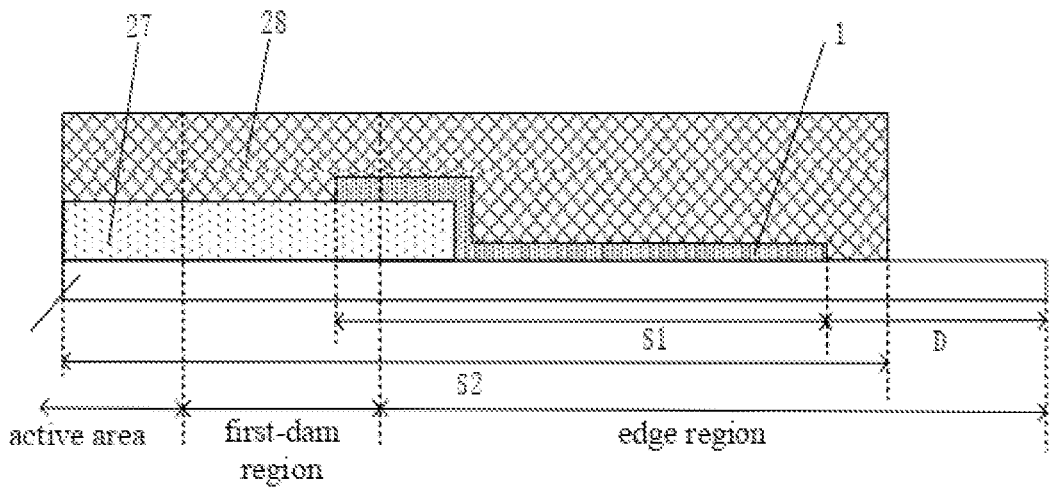
Figure 11:
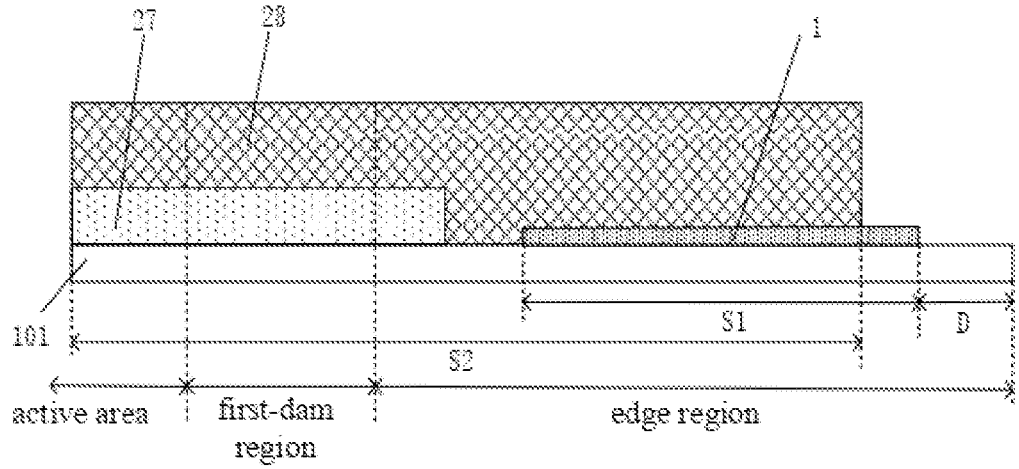

Optionally, referring to FIGS. 8, 9 and 11, the orthographic projection S1 of the anti-static layer 1 on the substrate 101 and the orthographic projection S2 of the second insulating layer 28 on the substrate 101 partially intersect or overlap. Alternatively, referring to FIG. 10, the orthographic projection S1 of the anti-static layer 1 on the substrate 101 is located within the orthographic projection S2 of the second insulating layer 28 on the substrate 101.

The distance between the edge of the anti-static layer away from the active area and the edge of the side of the edge region away from the active area is not limited. As an example, referring to FIGS. 8, 10 and 11, the edge of the anti-static layer away from the active area and the edge of the side of the edge region away from the active area may have a certain distance D therebetween. The magnitude of the distance is not limited; for example, D in FIGS. 8 and 11 may be 50 μm, and D in FIG. 10 may be 80 μm. Alternatively, referring to FIG. 9, the edge of the anti-static layer away from the active area and the edge of the side of the edge region away from the active area substantially coincide. The "substantially coincide" used herein includes coinciding and coinciding within a range of process errors.

In the structure shown in FIG. 9, the anti-static layer is provided with a large area, which can more rapidly and better absorb and release the electrostatic charges.

Figure 12:
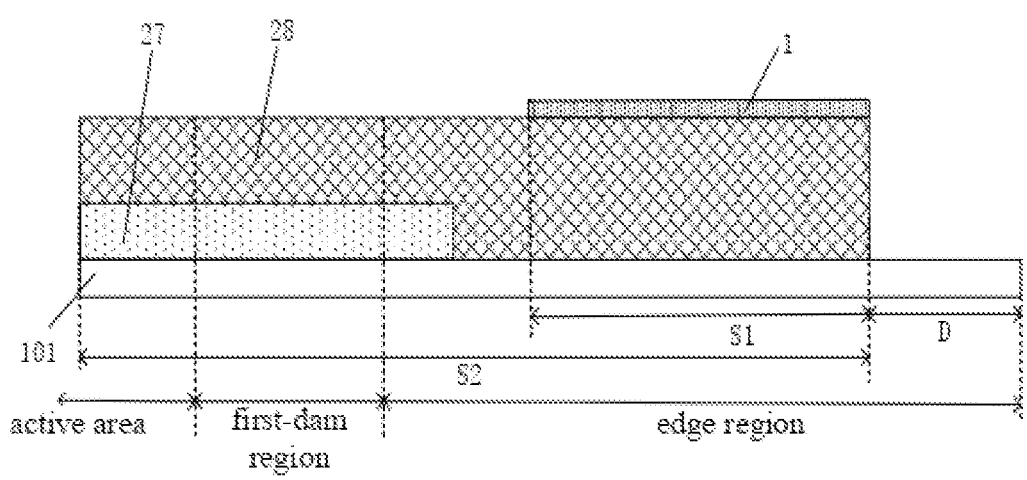

Optionally, when the anti-static layer is disposed at the side of the touch unit away from the substrate, referring to FIG. 12, the second insulating layer 28 located within the non-active area is disposed at the side of the anti-static layer 1 that is closer to the substrate 101.

It should be noted that FIGS. 7-12 merely emphatically demonstrate the position relations among the first insulating layer, the second insulating layer and the anti-static layer, and the other structures are not demonstrated.

The structures in which the anti-static layer is provided within the first non-active area A0 will be particularly described below.

In one or more embodiments, referring to FIG. 2a, within the first non-active area A0, the first-dam region A2 surrounds the active area A1, and the edge region A3 surrounds the first-dam region A2.

Referring to FIG. 2a, within the first non-active area A0, the edge region A3 includes a cutting-transition region A4, a crack-dam region A5 and a driving-circuit region A6. The crack-dam region A5 surrounds the first-dam region A2, and is broken at the driving-circuit region A6. The cutting-transition region A4 surrounds the crack-dam region A5 and the driving-circuit region A6.

Referring to FIGS. 2a, 13a and 14-16, the crack-dam region A5 includes one or more slots 33, and the slots 33 surround the first-dam region A2, and is broken at the driving-circuit region A6. The anti-static layer 1 covers at least some of the slots.

The quantity of the slots is not limited. FIGS. 13a and 14-16 illustrate by taking 5 slots arranged successively and separately as an example. The slots can reduce and disperse the stress generated in cutting, thereby reducing the risk in cracking generated in the cutting, and therefore the slots may also be referred to as a crack dam. The depth of the slots in the direction perpendicular to the substrate is not limited, and may be determined according to practical situations.

It should be noted that, if the driving-circuit region A6 employs a pad bending structure (i.e., bending the pad region to the non-displaying face of the base plate), then the disconnection position of the slots corresponds to a lead-wire region (fanout region) within the bending region. If the driving-circuit region A6 does not employ a pad bending structure, then the disconnection position of the slots corresponds to the pad region (bonding region).

Optionally, referring to FIGS. 13a and 14-16, the displaying base plate further includes a buffer layer 102, a gate insulating layer 100 and an inter-layer-medium layer 103 that are arranged sequentially in layer configuration. All of the inter-layer-medium layer 103, the gate insulating layer 100 and the buffer layer 102 are located within the active area, the first-dam region and the crack-dam region. The slots 33 extend throughout at least the part of the inter-layer-medium layer 103 that is located within the crack-dam region A5.

It should be noted that the slots 33 may extend throughout merely the part of the inter-layer-medium layer 103 that is located within the crack-dam region A5, as shown in FIGS. 13a and 14-16. Alternatively, the slots may also extend throughout the parts of the inter-layer-medium layer and the gate insulating layer that are located within the crack-dam region. Alternatively, the slots may also extend throughout the parts of the inter-layer-medium layer, the gate insulating layer and the buffer layer that are located within the crack-dam region, which is not limited herein.

Furthermore, the displaying base plate may further include an isolating layer located between the substrate and the buffer layer, and the isolating layer is located within the active area, the first-dam region and the crack-dam region. The slots may also extend throughout the parts of the inter-layer-medium layer, the gate insulating layer, the buffer layer and the isolating layer that are located within the crack-dam region.

Optionally, referring to FIGS. 13a and 14-16, the displaying base plate further includes a first planarization part 41 and a first protrusion 34, and the first planarization part 41 is located within the cutting-transition region A4 and the crack-dam region A5. Referring to FIG. 2a, the first protrusion 34 is located within the crack-dam region A5, surrounds the first-dam region A2, and is broken at the driving-circuit region A6.

Referring to FIGS. 13a and 14-16, the first planarization part 41 covers all of the slots 33, the first protrusion 34 is disposed at the side of the first planarization part 41 away from the substrate 101, and the anti-static layer 1 covers the first protrusion 34.

It should be noted that, if the driving-circuit region A6 employs a pad bending structure (i.e., bending the pad region to the non-displaying face of the base plate), then the disconnection position of the first protrusion corresponds to the lead-wire region (fanout region) within the bending region. If the driving-circuit region A6 does not employ a pad bending structure, then the disconnection position of the first protrusion corresponds to the pad region (bonding region).

The first planarization part covers all of the slots, and fills the slots, which can further reduce the risk in cracking generated in the cutting, and facilitates the deposition of the anti-static layer.

Referring to FIGS. 13a and 14-16, the edge closer to the cutting-transition region A4 of the entirety formed by the inter-layer-medium layer 103, the gate insulating layer 100 and the buffer layer 102 has one or more steps 35. The first planarization part 41 covers all of the steps 35.

The inter-layer-medium layer, the gate insulating layer and the buffer layer are commonly fabricated by using inorganic materials, and in the patterning using a dry etching process, residue is easily generated to form the above-described steps. The first planarization part covers all of the steps, which can serve to protect better.

Figure 13A:
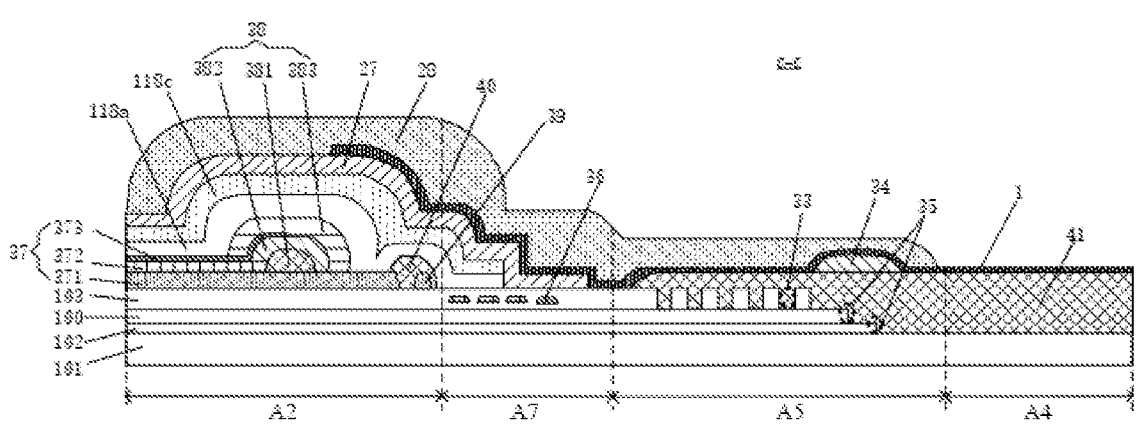
FIGS. 13*a* and 14-16 are multiple schematic cross-sectional views along a CC direction in FIG. 2*a*.
Figure 14:
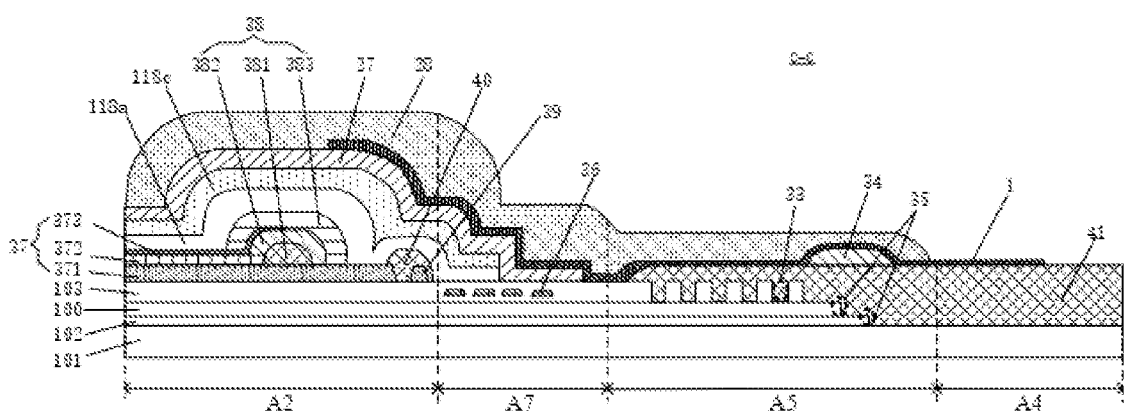
Figure 15:
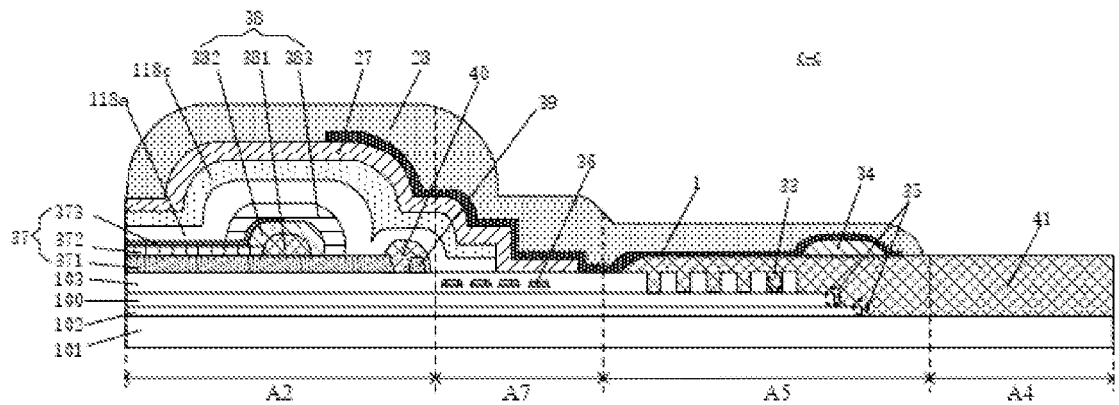

Optionally, referring to FIGS. 13a and 14-16, the edge region further includes a crack detecting region A7, and the crack detecting region A7 is located between the first-dam region A2 and the crack-dam region A5. Referring to FIGS. 13a and 14-15, the crack detecting region A7 includes a plurality of crack detecting lines 36, and the anti-static layer 1 covers all of the crack detecting lines 36 and all of the slots 33.

The quantity of the crack detecting lines is not limited. FIGS. 13a and 14-16 illustrate by taking 4 as an example.

The crack detecting region is mainly used for crack detection, to increase the product yield, and reduce the production cost.

Figure 16:
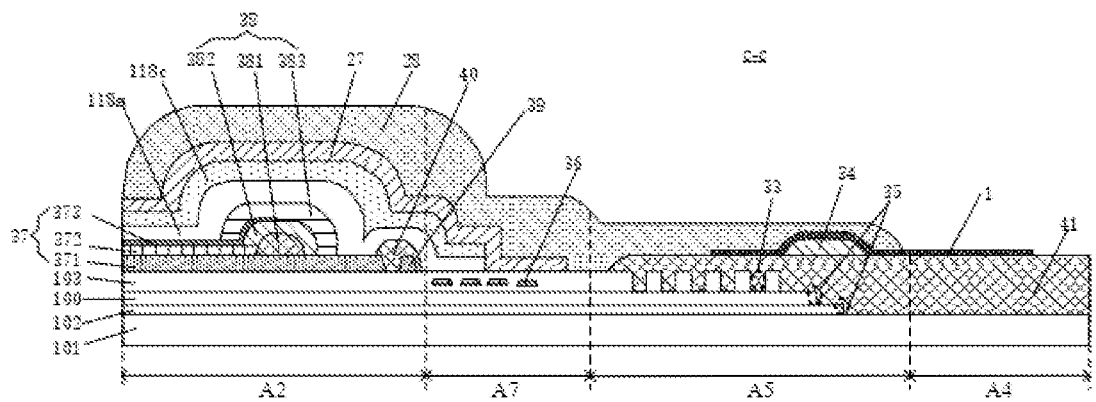

It should be noted that, referring to FIG. 16, the anti-static layer 1 may also merely cover some of the slots 33, and not cover the crack detecting lines 36.

Optionally, referring to FIGS. 13a and 14-15, the anti-static layer 1 is further located within the first-dam region A2. Referring to FIG. 2a, the non-active area further includes a wiring region A8, and the wiring region A8 is located between the first-dam region A2 and the active area A1.

Referring to FIGS. 13a and 14-15, the displaying base plate further includes a power-supply signal line 37, and the power-supply signal line 37 is located within the wiring region A8 and the first-dam region A2. Referring to FIGS. 13a and 14-15, the power-supply signal line 37 and the anti-static layer 1 partially intersect or overlap in the direction perpendicular to the substrate 101. Accordingly, the electrostatic charges generated by the friction of the finger on the screen surface can be absorbed and released by the power-supply signal line and the anti-static layer, respectively, and the power-supply signal line and the anti-static layer partially intersect or overlap in the direction perpendicular to the substrate, which can further ensure the effect of the absorption and releasing of the electrostatic charges.

It should be noted that, referring to FIG. 16, if the anti-static layer 1 is located merely within the cutting-transition region A4 and the crack-dam region A5, then the anti-static layer 1 and the power-supply signal line 37 do not intersect or overlap in the direction perpendicular to the substrate 101.

Figure 17:
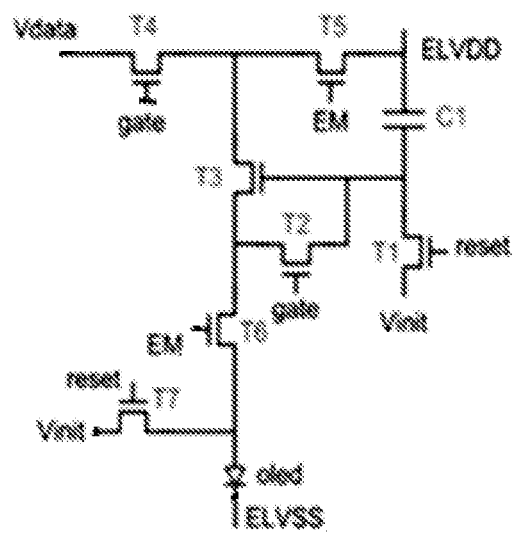
FIG. 17 is a diagram of a driving circuit according to an embodiment of the present application.
Figure 18:
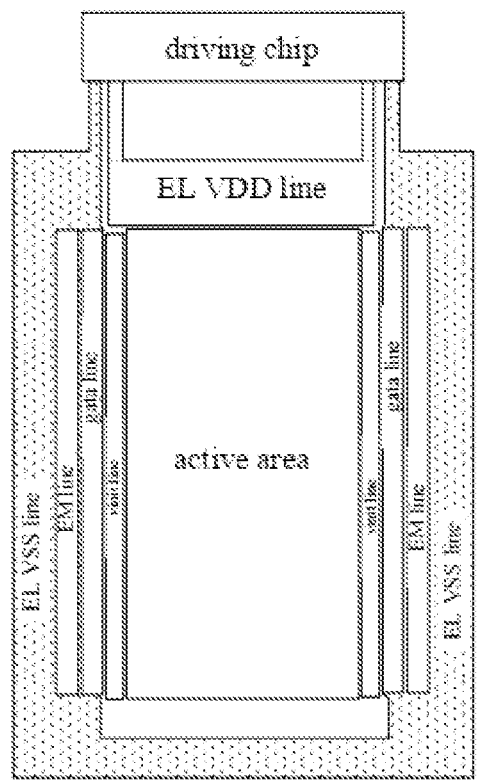
FIG. 18 is a diagram of the distribution of driving signal lines according to an embodiment of the present application.

The wiring region A8 may be used to dispose signal lines such as a power-supply signal line ELVSS. The displaying base plate may employ the 7T1C driving circuit shown in FIG. 17 (the principle of the driving of this electric circuit may be obtained by referring to the related art, and is not discussed further herein), and the driving circuit includes 7 thin-film transistors T1-T7, a capacitor C1 and an OLED light emitting diode. Except the driving transistor T3, all of the other transistors are controlled by different driving signals, for example, an ELVSS power-supply signal, a Vdata signal, a gate signal, an EM signal, a Vinit signal, an ELVDD signal and a reset signal. Moreover, all of those driving signals are supplied by the corresponding driving signal lines. The ELVSS power-supply signal line, the Vinit signal line and so on may be configured with reference to FIG. 18, wherein the ELVSS power-supply signal line may be electrically connected to a cathode located within the active area by a via hole, and the cathode is generally disposed in the whole layer within the active area. The quantity of the layers included by the ELVSS power-supply signal line is not limited herein. As an example, it may include two layers (which is of a single-SD structure), or three layers (which is of a double-SD structure), for example, a first power line 371, a second power line 372 and a third power line 373 shown in FIGS. 13a and 14-15, wherein the third power line 373 may be disposed in the same layer as a first electrode (used as the anode) located within the active area, so as to prevent the electric circuit thereunder from being interfered by light or static electricity, the first power line 371 may be disposed in the same layer as the source and the drain of the transistor located within the active area, and the second power line 372 may be disposed in the same layer as a switching electrode located within the active area.

Optionally, referring to FIGS. 13a and 14-16, all of the inter-layer-medium layer 103, the gate insulating layer 100 and the buffer layer 102 are further located within the wiring region (not shown in FIGS. 13a and 14-16) and the crack detecting region A7.

The first-dam region A2 includes at least one first dam 38, and the first dam 38 is disposed at the side of the inter-layer-medium layer 103 away from the substrate 101. The first dam 38 includes a second protrusion 381, a second planarization part 382 and a third planarization part 383 that are sequentially arranged. The second planarization part 382 coats the second protrusion 381, and the third planarization part 383 coats the second planarization part 382.

The second protrusion 381 and the first planarization part 41 are arranged in the same one layer, and the second planarization part 382 and the first protrusion 34 are arranged in the same one layer.

The quantity of the first dam is not limited herein. As an example, in order to improve the effect of the prevention on ink overflowing, two first dams may be employed. The structure of the two first dams may refer to FIG. 19. The base plate includes two first dams marked as 38a, 38, wherein the height in the direction perpendicular to the substrate 101 of the first dam 38a closer to the wiring region A8 is less than the height in the direction perpendicular to the substrate 101 of the first dam 38 away from the wiring region A8. The first dam 38a closer to the wiring region A8 blocks an organic packaging layer 118b.

Optionally, referring to FIGS. 13a and 14-16, the first-dam region A7 further includes a jumper wire 39 and a third protrusion 40, the third protrusion 40 is disposed at the side of the first dam 38 closest to the cutting-transition region A4 that is closer to the crack-dam region A5, the jumper wire 39 is disposed at the side of the inter-layer-medium layer 103 away from the substrate 101, the third protrusion 40 coats the jumper wire 39, and the third protrusion 40, the second protrusion 381 and the first planarization part 41 are arranged in the same one layer.

The jumper wire stated above can release static electricity, to reduce the influence on the signal lines by static electricity.

Optionally, referring to FIGS. 13a and 14-16, the power-supply signal line 37 includes at least a first power line 371, and the first power line 371 is disposed at the side of the inter-layer-medium layer 103 away from the substrate 101. The first dam 38 is disposed at the side of the first power line 371 away from the substrate 101. The first power line 371 and the jumper wire 39 are arranged in the same one layer, and are disconnected from each other, and the third protrusion 40 further coats the edge of the first power line 371 that is closer to the cutting-transition region A4.

Figure 13B:
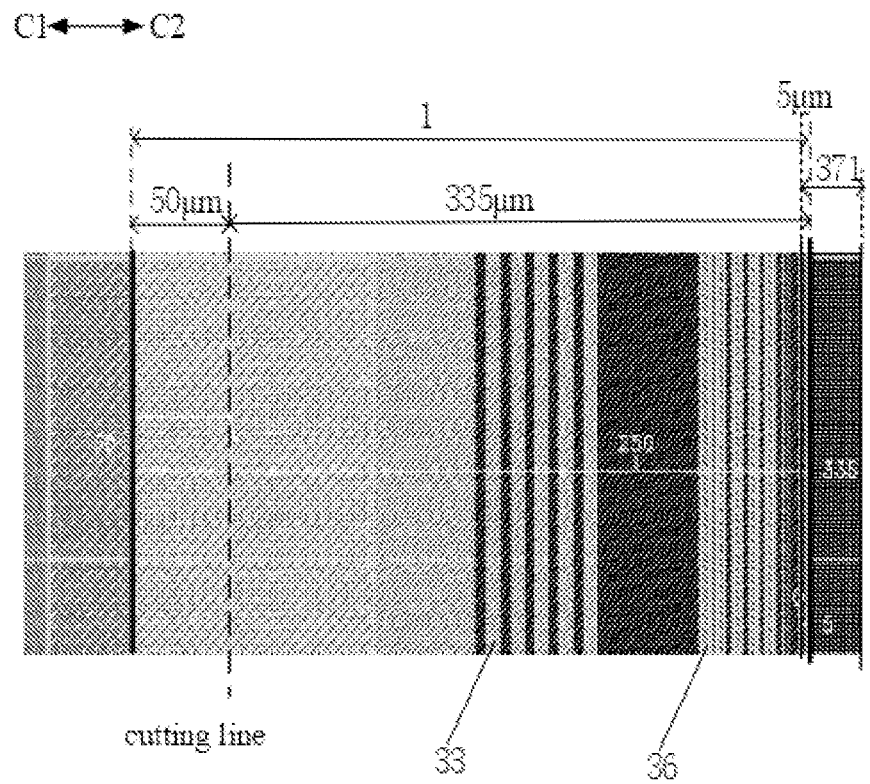
FIG. 13*b* is a top view of FIG. 13*a* before cutting.

Referring to FIGS. 13a, 13b, 14 and 15, the first power line 371 and the anti-static layer 1 partially intersect or overlap in the direction perpendicular to the substrate 101. After FIG. 13b is cut along the cutting line, the structure shown in FIG. 13a can be formed. FIG. 13b is a top view of the base plate. Referring to FIG. 13b, the anti-static layer 1 goes beyond the cutting line by 50 µm in the direction C1C2. Accordingly, after the cutting is completed, the edges of the anti-static layer and the edge region substantially coincide, the width of the anti-static layer obtained after the cutting in the direction C1C2 is 335 µm, and the width of the parts of the first power line 371 and the anti-static layer 1 that intersect or overlap in the direction perpendicular to the substrate is 5 µm. Certainly, the width in the direction C1C2 of the anti-static layer and the width in the direction C1C2 of the overlapping part of the anti-static layer and the first power line may be selected according to practical design situations, and the above width values are merely taken as an example herein for the description. The relative position relation between the first power line and the anti-static layer is described herein merely by using the structure before the cutting corresponding to FIG. 13a, and the cases of FIGS. 14-16 are similar to that, and are not discussed further herein.

The first power line may be disposed in the same layer as the source and the drain of the transistor located within the active area. Both of the first power line and the anti-static layer can serve to absorb and release the electrostatic charges, to further alleviate the adverse affection by the electrostatic charges.

Optionally, referring to FIGS. 13a, 13b and 14-16, the power-supply signal line 37 further includes a second power line 372 and a third power line 373. The third power line 373 is disposed at the side of the second power line 372 away from the substrate 101.

The edge of the second power line 372 that is closer to the cutting-transition region A4 is disposed between the second protrusion 381 and the second planarization part 382 of the first dam 38 closest to the cutting-transition region A4, and the edge of the third power line 373 that is closer to the cutting-transition region A4 is disposed between the second planarization part 382 and the third planarization part 383 of the first dam 38 closest to the cutting-transition region A4.

In FIGS. 13a and 14-16, the power-supply signal line 37 includes the first power line 371, the second power line 372 and the third power line 373, and is of the double-SD structure, wherein the third power line 373 may be disposed in the same layer as a first electrode (used as the anode) located within the active area, so as to prevent the electric circuit thereunder from being interfered by light or static electricity, the first power line 371 may be disposed in the same layer as the source and the drain of the transistor located within the active area, and the second power line 372 may be disposed in the same layer as a switching electrode located within the active area. The power-supply signal line may be electrically connected to a cathode located within the active area by a via hole.

In one or more embodiments, referring to FIGS. 3 and 4, the displaying base plate may further include a plurality of light emitting units 1d arranged in an array. The light emitting units 1d are located within the active area A1, and are disposed between the driving unit 3 and the touch unit 2.

Figure 20:
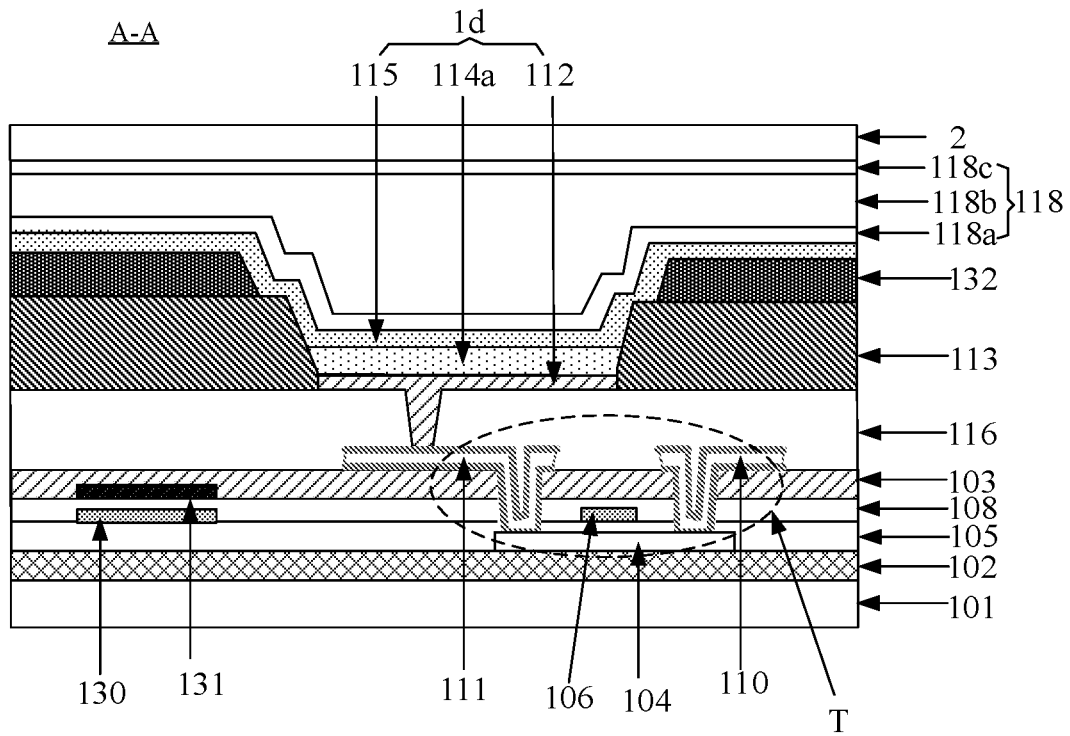
FIG. 20 and FIG. 21 are two cross-sectional views along a AA direction in FIG. 2*a*.
Figure 21:
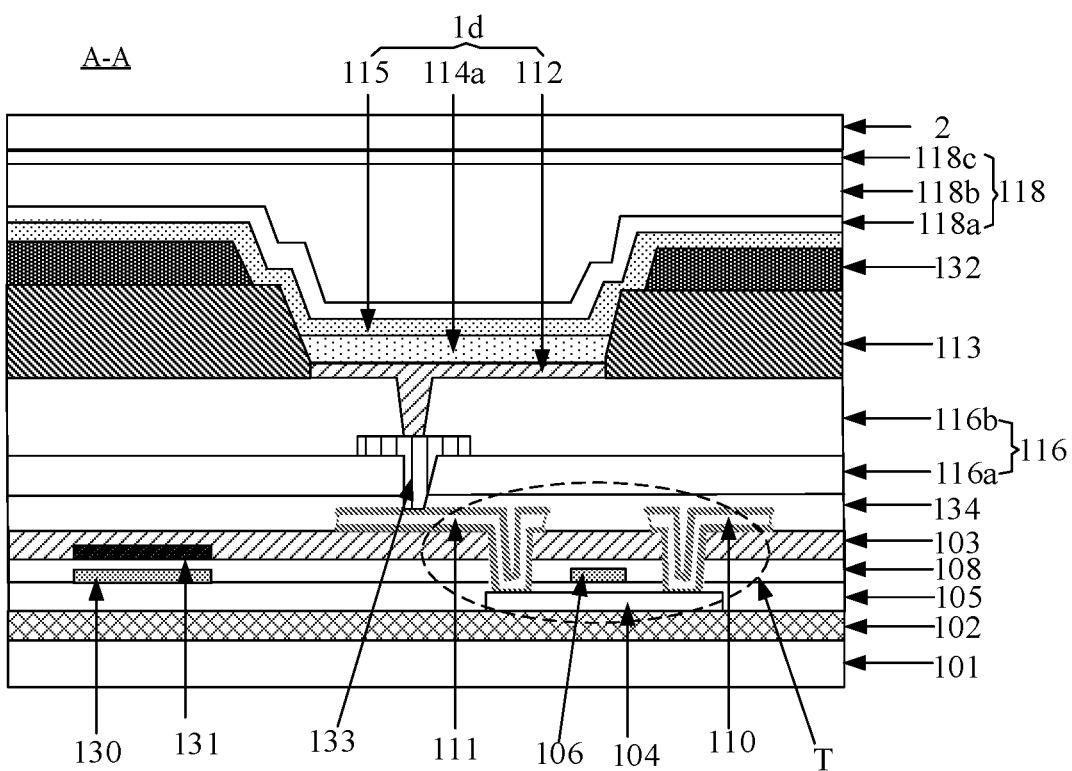

Referring to FIGS. 20 and 21, each of the light emitting units 1d includes a first electrode 112, a luminescent functional layer 114a and a second electrode 115. The second electrode 115 is disposed at the side of the luminescent functional layer 114a away from the driving unit.

Referring to FIG. 21, the driving unit includes a plurality of transistors T arranged in an array, a plurality of switching electrodes 133 and a planarization layer 116, the planarization layer 116 includes a first planarization film 116a and a second planarization film 116b, the first planarization film 116a covers the transistors T, and the switching electrodes 133 are disposed between the first planarization film 116a and the second planarization film 116b, and are electrically connected to the transistors T. The first electrode 112 is disposed at the side of the second planarization film 116b away from the substrate 101, and is electrically connected to one of the switching electrodes 133.

The first power line is disposed in the same layer as the source and the drain of each of the transistors. The second power line is disposed in the same layer as the switching electrode. The third power line and the first electrode are arranged in the same one layer. The first planarization film, the first planarization part, the second protrusion and the third protrusion are arranged in the same one layer. The second planarization film, the second planarization part and the first protrusion are arranged in the same one layer.

In FIGS. 20 and 21, each of the transistors T includes a first pole 110, a second pole 111, a controlling pole 106 and an active layer 104, wherein any one of the first pole 110 and the second pole 111 is used as the source, the other is used as the drain, and the controlling pole 106 may be used as the gate. The type of the transistors is not limited herein, and they may be top-gate-type thin-film transistors, and may also be bottom-gate-type thin-film transistors. According to the position relation of the three electrodes, transistors may be classified into two types. One type is that the gate is located under the source and the drain, which type is referred to as the bottom-gate-type transistors. The other type is that the gate is located over the source and the drain, which type is referred to as the top-gate-type transistors. FIGS. 20 and 21 illustrate by taking the top gate type as an example. The material of the active layer is not limited herein. It may be an oxide semiconductor material, for example, indium gallium zinc oxide (IGZO), indium tin zinc oxide (ITZO) and indium zinc oxide (IZO), may also be low-temperature polycrystalline silicon (LTPS), and, certainly, may also be a material such as monocrystalline silicon.

Referring to FIGS. 20 and 21, the base plate may further include a first gate insulating sub-layer 105, a second gate insulating sub-layer 108, the inter-layer-medium layer 103, a passivation layer 134 and a capacitor unit. The capacitor unit may include a first polar plate 130 and a second polar plate 131, the first polar plate 130 is disposed in the same layer as the gate 106, and the second polar plate 131 is located between the second gate insulating sub-layer 108 and the inter-layer-medium layer 103, and faces the first polar plate 130.

It should be noted that, if the capacitor unit is not disposed, then it is merely required to dispose one gate insulating sub-layer. The first gate insulating sub-layer and the second gate insulating sub-layer may also be provided within the non-active area, to form the gate insulating layer.

The materials of the gate, the first polar plate and the second polar plate may include a metal material or an alloy material, for example, including molybdenum, aluminum and titanium. The materials of the first pole and the second pole may include a metal material or an alloy material, for example, a monolayer or multilayer metal structure formed by molybdenum, aluminum, titanium and so on. As an example, the multilayer structure is a multi-metal-layer tandem, for example, a titanium-aluminum-titanium three-layer metal tandem (Al/Ti/Al). The planarization layer is generally fabricated by using an organic material, for example, a photoresist, an acrylic-acid-based polymer or a silicon-based polymer.

The first electrode may be used as the anode. The anode may be fabricated by using materials such as indium tin oxide (ITO), indium zinc oxide (IZO) and zinc oxide (ZnO). Referring to FIGS. 20 and 21, the base plate further includes a pixel defining part 113, and the pixel defining part 113 is disposed at the side of the planarization layer 116 away from the substrate 101. The pixel defining part 113 may be fabricated by using an organic material, for example, a photoresist. Furthermore, the part of the pixel defining part 113 that is located within the active area A1 has a pixel opening exposing the first electrode 112. The luminescent functional layer 114a is located within the pixel opening and is formed on the first electrode 112.

The luminescent functional layer may include a small-molecule organic material or a polymer-molecule organic material, and may also be a fluorescent luminescent material or a phosphorescent luminescent material, and it may emit the red light, the green light, the blue light and so on. Furthermore, according to different practical demands, in different examples, the luminescent functional layer may further include functional layers such as an electron injection layer, an electron transporting layer, a hole injection layer and a hole transporting layer. The second electrode covers the luminescent functional layer. The second electrode 115 may be used as the cathode, and its material may be a metal material such as lithium (Li), aluminum (Al), magnesium (Mg) and silver (Ag).

It should be noted that, as shown in FIGS. 20 and 21, the first electrode 112, the luminescent functional layer 114a and the second electrode 115 may form one light emitting unit 1d. The part of the base plate that is located within the active area may include a plurality of light emitting units arranged in an array. Additionally, it should also be noted that the first electrodes of the light emitting units are independent of each other, and the second electrodes of the light emitting units are of an integral structure, and may be provided in the whole layer.

In one or more embodiments, referring to FIGS. 20 and 21, a supporting part 132 may be disposed at the side of the pixel defining part 113 away from the substrate 101. The supporting part 132 may serve to support a protecting film layer (not shown in FIGS. 20 and 21), to prevent the protecting film layer from contacting with the first electrode 112 or other traces, which easily results in easy damage of the first electrode 112 or the other traces. It should be noted that the protecting film layer is mainly used in the process of the transportation of a semi-finished product, to prevent damage of the semi-finished product in the transportation process. Particularly, in the process of transporting the base plate whose supporting part 132 has been completely fabricated to a vapor-deposition production line, it may be covered by the protecting film layer, and when it is required to perform the vapor deposition of the luminescent material, the protecting film layer is removed.

As an example, the material of the supporting part 132 may be the same as the material of the pixel defining part 113, and the supporting part 132 and the pixel defining part 113 may be formed by using the same one one-step patterning process, but are not limited thereto. The material of the supporting part 132 may also be different from the material of the pixel defining part 113, and the supporting part 132 and the pixel defining part 113 may also be formed by using different patterning processes.

In one or more embodiments, referring to FIG. 20, the first electrode 112 may be directly electrically connected to the second pole 111 by a via hole in the planarization layer 116. The structure shown in FIG. 3 is of the single-SD structure, and at this moment, the power-supply signal line located within the non-active area may be of a two-layer structure. As an example, the power-supply signal line may include two layers of the power line, wherein one layer of the power line is disposed in the same layer as the first pole and the second pole (i.e., the source and the drain) of the transistor, and the other layer of the power line is disposed in the same layer as the first electrode.

In one or more embodiments, referring to FIG. 21, the first electrode 112 may also be electrically connected to the second pole 111 by the switching electrode 133. When the first electrode 112 is electrically connected to the second pole 111 by the switching electrode 133, the planarization layer 116 may be of a double-layer structure, and may particularly include the first planarization film 116a and the second planarization film 116b that are sequentially formed. Additionally, the passivation layer 134 may be formed between the first planarization film 116a and the inter-layer-medium layer 103. The passivation layer 134 may be formed by materials such as silicon oxide, silicon nitride and silicon oxynitride. The passivation layer 134 covers the first pole 110 and the second pole 111. It should be noted that, when the planarization layer 116 is a single layer, the passivation layer 134 may also be formed between the planarization layer 116 and the inter-layer-medium layer 103. Moreover, the switching electrode 133 is formed between the first planarization film 116a and the second planarization film 116b, sequentially passes through the via holes (for example, metal via holes) in the first planarization film 116a and the passivation layer 134 and is electrically connected to the second pole 111. Moreover, the first electrode 112 may pass through the via hole (for example, a metal via hole) in the second planarization film 116b and be electrically connected to the switching electrode 133, as shown in FIG. 4, but is not limited thereto. The switching electrode 133 may also be formed between the first planarization film 116a and the passivation layer 134.

The structure shown in FIG. 21 is of the double-SD structure, and at this moment, the power-supply signal line located within the non-active area may be of a three-layer structure. As an example, the power-supply signal line may include the first power line 371, the second power line 372 and the third power line 373 shown in FIGS. 13a and 14-15, wherein the first power line is disposed in the same layer as the first pole and the second pole (i.e., the source and the drain) of the transistor, the second power line is disposed in the same layer as the switching electrode, and the third power line and the first electrode are arranged in the same one layer. Referring to FIGS. 21, 13a and 14-16, the first planarization film 116a, the first planarization part 41, the second protrusion 381 and the third protrusion 40 are arranged in the same one layer, and the second planarization film 116b, the second planarization part 382 and the first protrusion 34 are arranged in the same one layer, which can reduce the time quantity of the patterning processes, to reduce the fabrication cost.

In one or more embodiments, referring to FIGS. 3 and 4, the displaying base plate further includes a packaging unit 118, and a plurality of light emitting units 1d arranged in an array. The packaging unit 118 covers the light emitting units 1d, and is disposed between the light emitting units 1d and the touch unit 2. The packaging unit 118 is located within the non-active area and the active area, and the light emitting units are located within the active area.

Figure 19:
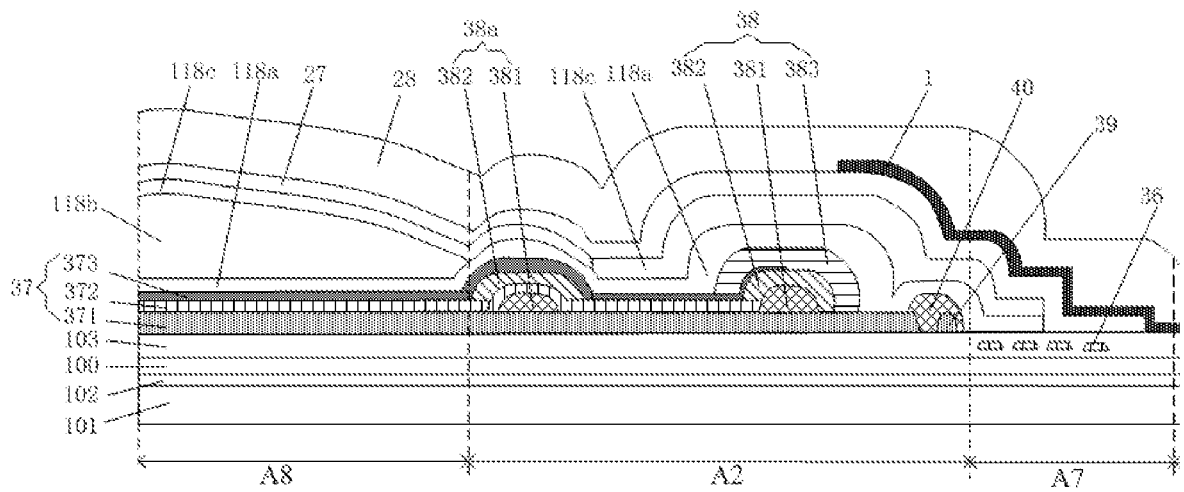
FIG. 19 is a schematic structural diagram of a wiring region and a first-dam region according to an embodiment of the present application.

Referring to FIGS. 20 and 21, the packaging layer 118 includes a first inorganic packaging layer 118a, an organic packaging layer 118b and a second inorganic packaging layer 118c that are arranged sequentially in layer configuration. Referring to FIGS. 19, 20 and 21, the first inorganic packaging layer 118a and the second inorganic packaging layer 118c are configured to package the first-dam region A2 and the light emitting units 1d. The organic packaging layer 118b is configured to package the light emitting units 1d, and is broken within the first-dam region A2.

The first inorganic packaging layer and the second inorganic packaging layer may be fabricated by chemical vapor deposition, but are not limited thereto, and may also be formed by physical vapor deposition and so on. The organic packaging layer may be fabricated by ink-jet printing, but is not limited thereto, and may also employ spray coating and so on. In the process of the fabrication of the organic packaging layer, because the organic packaging material has a certain fluidity, it is required to dispose the dam within the first-dam region, to block overflowing of the organic packaging material, thereby preventing the problem of packaging failure.

The structures in which the anti-static layer is provided within the second non-active area B0 will be particularly described below.

In one or more embodiments, referring to FIG. 2a, within the non-active area B0, the edge region B6 includes an opening region B1 and a transition region B3. The transition region B3 surrounds the opening region B1, and the first-dam region B2 surrounds the transition region B3. Referring to FIGS. 22-25, the anti-static layer 1 is located at least within the transition region B3.

Figure 22:
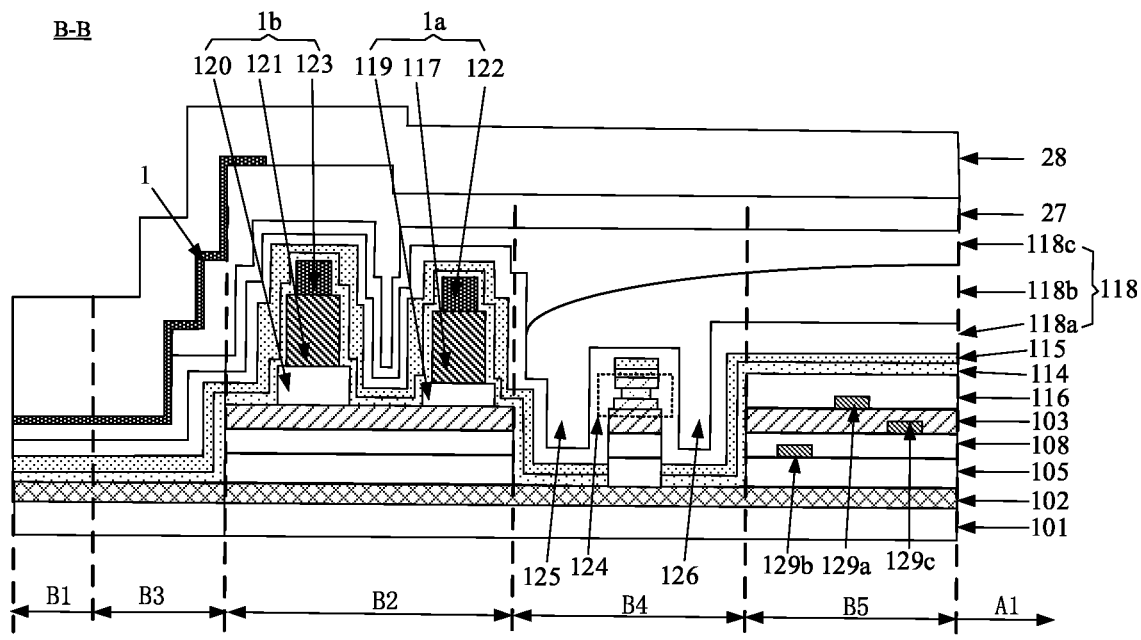
FIGS. 22-25 are multiple cross-sectional views along a BB direction in FIG. 2*a*.
Figure 23:
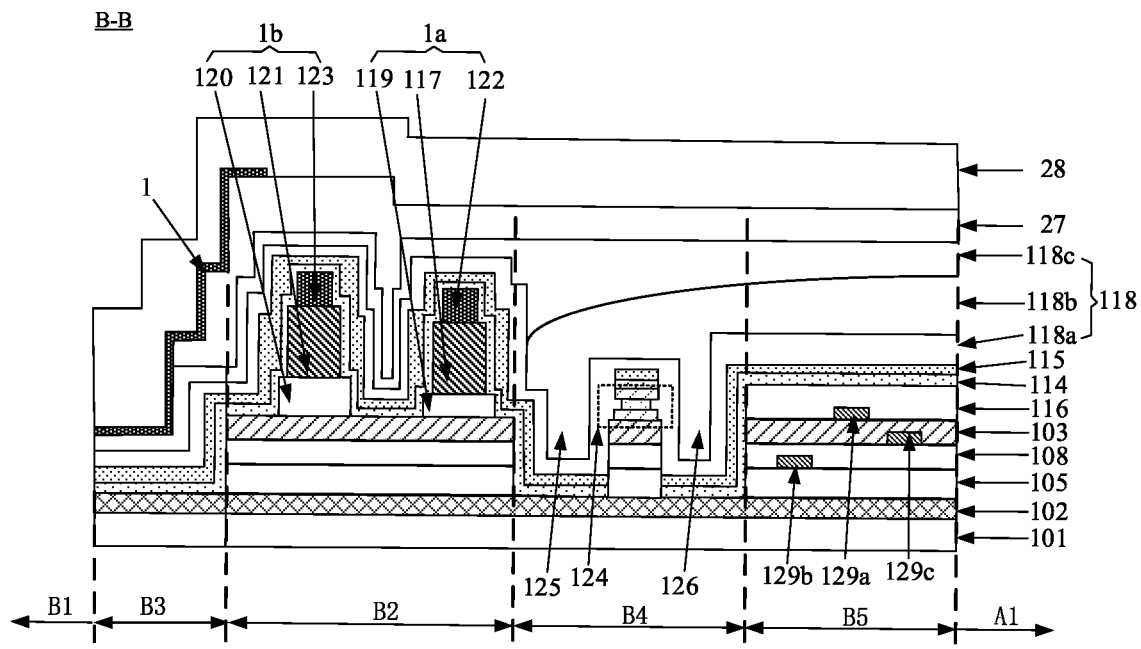
Figure 24:
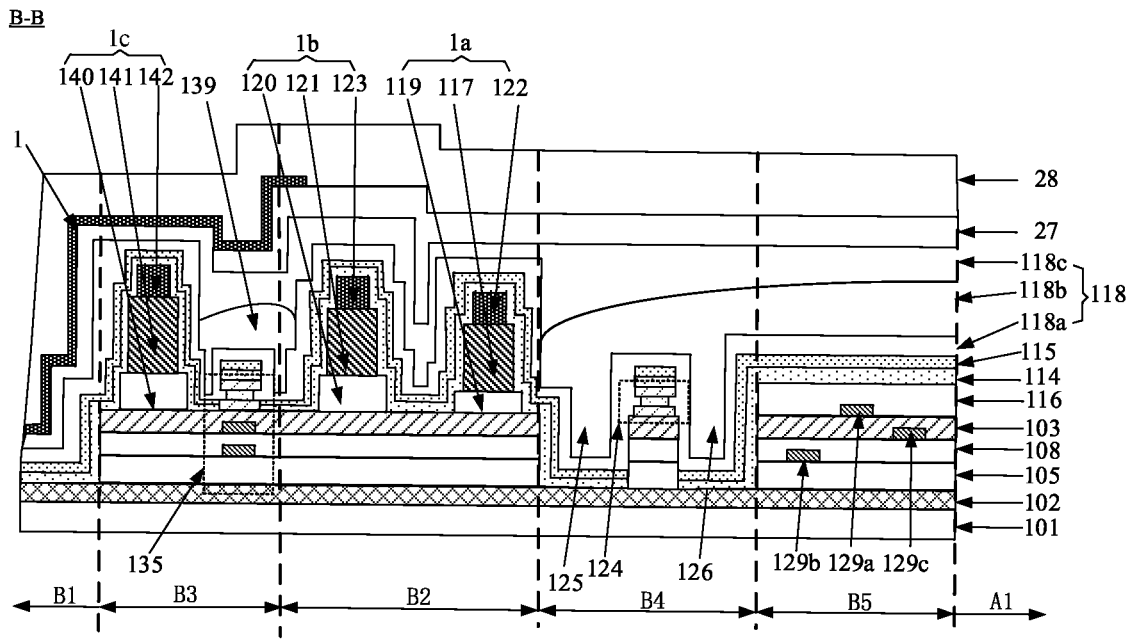
Figure 25:
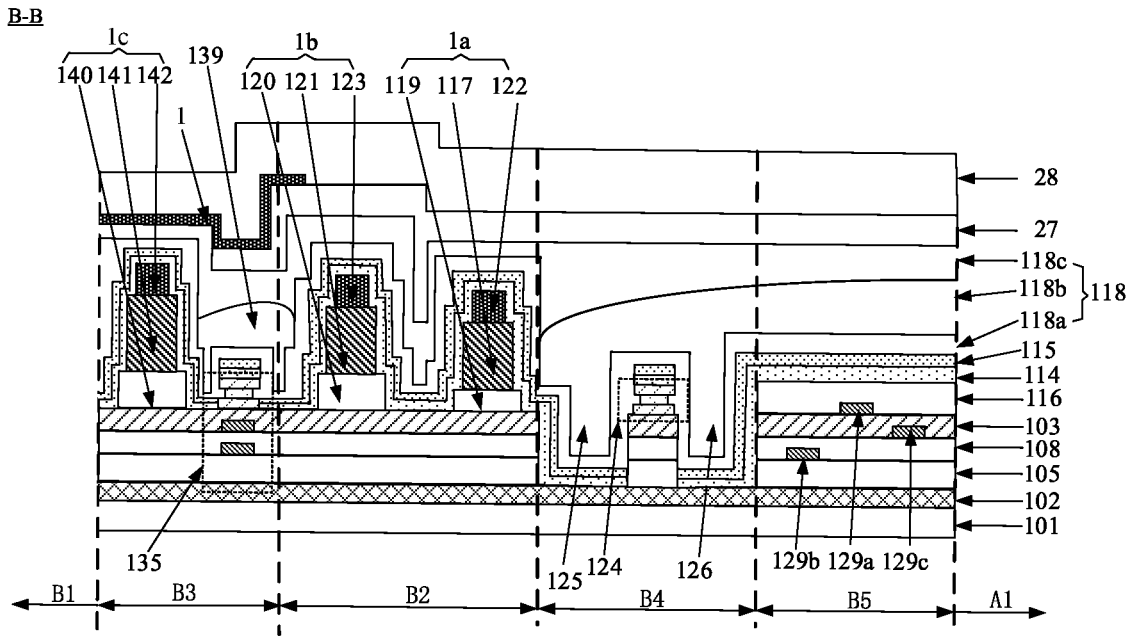

It should be noted that the opening treatment region B1 in the displaying base plate according to the present application, after the opening treatment, is used for the assembling of the devices such as a camera, a sensor, an HOME button, an earphone and a loudspeaker. Regarding the displaying base plate according to the present application, the opening region B1 may not undergo the opening treatment, as shown in FIGS. 22 and 24, and the opening treatment is subsequently performed before the assembling of the devices such as a camera. Alternatively, the opening region B1 may also undergo the opening treatment, as shown in FIGS. 23 and 25, and in this case, the displaying base plate may directly undergo the subsequent assembling.

The shape of the opening region is not limited herein, and it may be a runway hole, a circular hole and so on. After the opening treatment, the obtained opening may include but is not limited to a through hole, a slot, an opening and so on. Furthermore, the quantity of the opening region is not limited. As an example, the displaying base plate may be provided with a single hole or double holes. FIG. 2a illustrates by taking a single hole as an example.

That the anti-static layer is located at least within the transition region includes that the anti-static layer is located merely within the transition region, or that the anti-static layer is located within the transition region and the first-dam region, or that the anti-static layer is located within the transition region and the opening region, or that the anti-static layer is located within the transition region, the opening region and the first-dam region, and so on, which is not limited herein. FIGS. 22-25 illustrate by taking the case as an example in which the anti-static layer is located within a part of the first-dam region and the whole of the transition region and the opening region.

The anti-static layer can serve to block and release the electrostatic charges, to highly reduce the electric charges that are conducted via the transition region, thereby reducing the probability that the transistors of the driving unit have characteristic deviation, so as to finally improve the effect of displaying.

Optionally, referring to FIGS. 24 and 25, the transition region B3 includes at least one second dam 1c, and the second dam 1c is disposed at the side of the anti-static layer 1 that is closer to the substrate 101, and at least partially intersects or overlaps with the anti-static layer 1 in the direction perpendicular to the substrate 101.

That the second dam at least partially intersects or overlaps with the anti-static layer in the direction perpendicular to the substrate includes that the second dam partially intersects or overlaps with the anti-static layer in the direction perpendicular to the substrate, at this moment, the orthographic projection of the second dam on the substrate and the orthographic projection of the anti-static layer on the substrate partially intersect or overlap, or that the second dam wholly intersects or overlaps with the anti-static layer in the direction perpendicular to the substrate, at this moment, the orthographic projection of the second dam on the substrate is located within the orthographic projection of the anti-static layer on the substrate. In FIGS. 24 and 25, the anti-static layer 1 is located within the whole transition region B3, and the second dam 1c wholly intersects or overlaps with the anti-static layer 1 in the direction perpendicular to the substrate 101.

The particular quantity of the second dam is not limited herein. FIGS. 24-25 illustrate by taking one second dam as an example.

Referring to FIGS. 24-25, the second dam 1c may include a first protecting part 140, a first blocking part 141 and a first cushion part 142 that are arranged sequentially in layer configuration.

In one or more embodiments, referring to FIGS. 21 and 24, the first protecting part 140 may be disposed in the same layer as the first electrode 112 of the active area. Because the first electrically conductive thin film covers the inter-layer-medium layer 103 located within the transition region B3, in the process of patterning to form the first electrode 112, the inter-layer-medium layer 103 located within the transition region B3 is not washed by the etchant in this process, which reduces the time quantity that the inter-layer-medium layer 103 within the transition region B3 is washed by the etchant, and thus the adhesive force of the inter-layer-medium layer 103 located within the transition region B3 may be increased. Furthermore, in the process of forming the first electrode 112, the first protecting part 140 can be simultaneously formed, and therefore the first protecting part 140 can continue to protect the inter-layer-medium layer 103 located within the transition region B3, to prevent the etchant from washing the inter-layer-medium layer 103 located within the transition region B3 in the subsequent patterning process. Because the first protecting part 140 and the first electrode 112 are formed by using a one-step patterning process, the processing steps and the usage of masks can be reduced, which can reduce the cost.

In one or more embodiments, referring to FIGS. 21 and 24, the first protecting part 140 may be disposed in the same layer as the planarization layer 116. Because the planarization thin film covers the inter-layer-medium layer 103 located within the transition region B3, in the process of patterning to form the planarization layer 116, the inter-layer-medium layer 103 located within the transition region B3 is not washed by the etchant in this process, which reduces the time quantity that the inter-layer-medium layer 103 within the transition region B3 is washed by the etchant, and thus the adhesive force of the inter-layer-medium layer 103 located within the transition region B3 may be increased. In the process of forming the planarization layer 116, the first protecting part 140 is simultaneously formed, and therefore the first protecting part 140 can continue to protect the inter-layer-medium layer 103 located within the transition region B3, to prevent the etchant from washing the inter-layer-medium layer 103 located within the transition region B3 in the subsequent patterning process. Because the first protecting part 140 and the planarization layer 116 are formed by using a one-step patterning process, the processing steps and the usage of masks can be reduced, which can reduce the cost.

In one or more embodiments, referring to FIGS. 21 and 24, the first blocking part 141 may be disposed in the same layer as the pixel defining part 113 within the active area. Therefore, the material of the first blocking part 141 is the same as the material of the pixel defining part 113, and is also an organic material. In the present embodiment, the first protecting part 140 is disposed in the same layer as the planarization layer 116, whereby the material of the first protecting part 140 is the same as the material of the planarization layer 116, and is also an organic material, and the material of the first protecting part 140 may be the same as the material of the first blocking part 141. Such a design can increase the binding force between the first protecting part 140 and the first blocking part 141, to ensure the structural stability of the second packaging dam 1c, and prevent the first blocking part 141 from falling from the first protecting part 140, so as to further reduce the risk in packaging failure, increase the packaging yield, and ensure the effect of displaying and the service life of the product.

The first cushion part may be disposed in the same layer as the supporting part 132 within the active area, and it can increase the thickness of the second dam 1c in the direction perpendicular to the substrate. The first cushion part can block the organic packaging material in the packaging unit 118 from flowing to the opening region B1, which further increases the restriction on the flowing of the organic packaging material in the packaging unit, and further improves the reliability of the packaging of the displaying base plate.

Certainly, the second dam may also be of a two-layer structure, which is not limited herein, and may be decided particularly according to practical situations.

In the present application, the provision of the second dam can further improve the effect of the blocking, whereby the transition region can sufficiently isolate the opening region and the active area, to prevent impurities such as water and oxygen from entering the active area from the opening region, and prevent cracks that might be formed in the formation of the opening region from extending to the active area.

It should be noted that, in one or more embodiments, in order to save the space, referring to FIGS. 22-23, the transition region B3 is not provided with the second dam, and the blocking of the organic packaging material can be realized by relying on the dam of the first-dam region.

In one or more embodiments, referring to FIGS. 22-25, the first-dam region B2 includes at least one third dam, and the third dam and the second dam are arranged in the same one layer. The anti-static layer 1 and the third dam do not intersect or overlap in the direction perpendicular to the substrate.

The quantity of the third dam is not limited. FIGS. 22-25 illustrate by taking the case as an example in which the first-dam region B2 includes two third dams, wherein the two third dams are marked as 1b and 1a.

Referring to FIGS. 22-25, the third dam 1b closer to the second dam 1c and the third dam 1a further from the second dam 1c have the same structure as the structure of the second dam 1c, and are disposed in the same layer as the second dam 1c, and the advantageous effects of the corresponding structures are similar, and are not discussed further herein. Particularly, the third dam 1b closer to the second dam 1c includes a second protecting part 120, a second blocking part 121 and a second cushion part 123 that are arranged sequentially in layer configuration. The third dam 1a away from the second dam 1c includes a third protecting part 119, a third blocking part 117 and a third cushion part 122 that are arranged sequentially in layer configuration.

The first protecting part, the second protecting part and the third protecting part are arranged in the same one layer. The first blocking part, the second blocking part and the third blocking part are arranged in the same one layer. The first cushion part, the second cushion part and the third cushion part are arranged in the same one layer.

The thickness in the direction perpendicular to the substrate of the third dam 1b closer to the second dam 1c may be greater than the thickness in the direction perpendicular to the substrate of the third dam 1a further from the second dam 1c, to realize the blocking better. As an example, the thickness in the direction perpendicular to the substrate of the second protecting part may be greater than the thickness in the direction perpendicular to the substrate of the third protecting part, the thicknesses of the second blocking part and the third blocking part in the direction perpendicular to the substrate are equal, and the thicknesses of the second cushion part and the third cushion part in the direction perpendicular to the substrate are equal, thereby realizing that the thickness in the direction perpendicular to the substrate of the third dam 1b closer to the second dam 1c is greater than the thickness in the direction perpendicular to the substrate of the third dam 1a further from the second dam 1c. Certainly, other approaches may be used to realize the unequal heights of the two dams.

The third dam can effectively serve to block the organic packaging material, thereby improving the effect of packaging and the effect of displaying.

In one or more embodiments, referring to FIGS. 24 and 25, the transition region B3 further includes a blocking wall 135, and the blocking wall 135 is located between the second dam 1c and the third dam 1b, and surrounds the second dam 1c.

The blocking wall is disposed at the side of the anti-static layer that is closer to the substrate. The blocking wall and the anti-static layer at least partially intersect or overlap or do not intersect or overlap in the direction perpendicular to the substrate, which may be selected particularly according to demands. FIGS. 24 and 25 illustrate by taking the case as an example in which the blocking wall and the anti-static layer wholly intersect or overlap in the direction perpendicular to the substrate, at this moment, the orthographic projection of the blocking wall on the substrate is located within the orthographic projection of the anti-static layer on the substrate.

Figure 26:
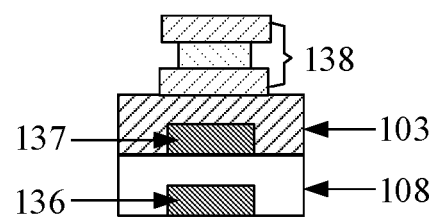
FIG. 26 is a schematic structural diagram of a blocking wall according to an embodiment of the present application.

Referring to FIGS. 21 and 26, the blocking wall may include a first film layer 136 disposed in the same layer as the controlling pole 106 and the first polar plate 130, a second film layer 137 disposed in the same layer as the second polar plate 131, a third film layer 138 disposed in the same layer as the first pole 110 and the second pole 111, the second gate insulating sub-layer 108 located between the first film layer 136 and the second film layer 137, and the inter-layer-medium layer 103 located between the third film layer 138 and the second film layer 137. In other words, the first film layer 136, the controlling pole 106 and the first polar plate 130 have the same structure, include the same material, and may be fabricated by using a one-step patterning process. The second film layer 137 and the second polar plate 131 have the same structure, include the same material, and may be fabricated by using a one-step patterning process. The third film layer 138, the first pole 110 and the second pole 111 have the same structure, include the same material, and may be fabricated by using a one-step patterning process.

In one or more implementations, referring to FIGS. 24 and 25, the transition region B2 may further include an organic insulating packaging part 139. The organic insulating packaging part 139 is between the second dam 1c and the third dam 1b, and covers the blocking wall 135. The material of the organic insulating packaging part 139 is the same as the material of the organic packaging layer 118b of the packaging unit 118, and they may be formed by using the same ink-jet printing process.

In the present application, by disposing the second packaging dam 1c, the blocking wall 135 and the organic insulating packaging part 139, the effect of further blocking is provided, whereby the transition region B3 can sufficiently isolate the opening region B1 and the active area A1, to prevent impurities such as water and oxygen from entering the active area A1 from the opening region B1, and prevent cracks that might be formed in the formation of the opening region B1 from extending to the active area A1.

Furthermore, referring to FIGS. 24 and 25, when the transition region B3 includes the second dam 1c, the blocking wall 135 and the organic insulating packaging part 139, the first inorganic packaging layer 118a described above also covers the second dam 1c and the blocking wall 135, the organic packaging layer 118b and the organic insulating packaging part 139 are formed by ink-jet printing, and the second inorganic packaging layer 118c further covers the second dam 1c, the blocking wall 135 and the organic insulating packaging part 139. Referring to FIGS. 24 and 25, when the first-dam region B2 includes the third dams 1b, 1a, the first inorganic packaging layer 118a and the second inorganic packaging layer 118c further cover the third dams 1b, 1a, and the organic packaging layer 118b is blocked by the third dams 1b, 1a.

It should be noted that, in the present application, as shown in FIG. 2a, when the opening region B1 is circular, the orthographic projections on the substrate of the second dam 1c, the third packaging dams 1b, 1a and the blocking wall 135 may also be round rings, and when the opening region B1 is rectangular, the orthographic projections on the substrate of the second dam 1c, the third packaging dams 1b, 1a and the blocking wall 135 may also be rectangular rings, but are not limited thereto. The opening region B1 may also have other regular or irregular shapes, and the second dam 1c, the third packaging dams 1b, 1a and the blocking wall 135 may match therewith.

In one or more implementations, referring to FIGS. 22-25, the non-active area further includes an isolating region B4, the isolating region B4 is located between the first-dam region B2 and the active area A1, and surrounds the first-dam region B2.

Figure 27:
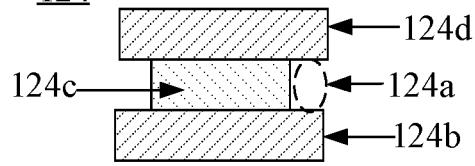
FIG. 27 is a schematic structural diagram of an isolating pillar according to an embodiment of the present application.

Referring to FIGS. 22-25, the isolating region B4 includes an isolating pillar 124, and the isolating pillar 124 surrounds the first-dam region B2. Referring to FIG. 27, the side wall of the isolating pillar 124 is provided with a partitioning slot 124a.

The quantity of the isolating pillar is not limited to one, and may also be more than one.

In one or more implementations, the isolating pillar may be disposed in the same layer as the first pole 110 and the second pole 111 of thin-film transistor. If the first pole 110 and the second pole 111 are of a three-layer metal structure, then the isolating pillar may also be of a three-layer metal structure. As an example, as shown in FIG. 27, the isolating pillar 124 may include a first metal layer 124b, a second metal layer 124c and a third metal layer 124d that are arranged sequentially in layer configuration. The outer boundary of the orthographic projection of the second metal layer 124c on the substrate is located within the outer boundaries of the orthographic projections of the first metal layer 124b and the third metal layer 124d on the substrate, to form the partitioning slot 124a at the side wall of the isolating pillar 124, whereby the longitudinal cross section of the isolating pillar 124 is of an I-shaped structure. Accordingly, in the vapor deposition of the luminescent material or the cathode material, the luminescent-material layer 114 and the cathode (i.e., the second electrode 115) can be disconnected at the partitioning slot 124a, which can block the path of erosion by the water and oxygen within the opening region B1 to the active area A1, thereby further preventing erosion of the active area A1, to improve the effect of displaying of the displaying base plate and prolong the service life of the product.

In one or more implementations, referring to FIGS. 22-25, the isolating region B4 includes a first groove 125 and a second groove 126. The first groove 125 is located at the side of the isolating pillar 124 that is closer to the third dam 1a, and the first groove 125 surrounds the third dam 1a. The second groove 126 is located at the side of the isolating pillar 124 that is closer to the active area A1, and the second groove 126 surrounds the first groove 125. Such a design can increase the probability that the luminescent material is broken at the side face of the isolating pillar 124.

In FIGS. 22-25, the first groove and the second groove may be formed by removing the parts of the inter-layer-medium layer 103, the second gate insulating sub-layer 108 and the first gate insulating sub-layer 105 that are located within the region of the isolating region B4 that is not provided with the isolating pillar 124. Certainly, they may also be formed in other manners, which is not discussed further herein.

In the present application, by disposing the first groove and the second groove, the probability that the luminescent material or the cathode material is broken at the side face of the isolating pillar is further increased. Additionally, when the displaying base plate is flexible and is being curved, such a design can release a part of the stress, to ensure the reliability.

It should be noted that, in the present application, as shown in FIG. 2a, when the opening region B1 is circular, the orthographic projections on the substrate of the isolating pillar, the first groove and the second groove may also be round rings, and when the opening region B1 is rectangular, the orthographic projections on the substrate of the isolating pillar, the first groove and the second groove may also be rectangular rings, but are not limited thereto. The opening region B1 may also have other regular or irregular shapes, and the isolating pillar, the first groove and the second groove may match therewith.

In one or more implementations, referring to FIGS. 22-25, the non-active area further includes a trace region B5, and the trace region B5 is located between the isolating region B4 and the active area A1, and surrounds the isolating region B4.

The trace region B5 includes a plurality of traces, and the traces of the trace region are electrically connected to the traces corresponding to the active area.

Referring to FIGS. 22-25, the trace region B5 may include a first trace 129a, a second trace 129b and a third trace 129c.

The first trace may include a data signal line, but is not limited thereto, and at this moment, the first trace may be electrically connected to a data signal line within the active area. The second trace may include a gate line, but is not limited thereto, and at this moment, the second trace may be electrically connected to a gate line within the active area. The third trace may include a resetting signal line or an initializing line, but is not limited thereto, and at this moment, the third trace may be electrically connected to a resetting signal line or initializing line within the active area.

Alternatively, the first trace may include a gate line, but is not limited thereto, and at this moment, the first trace may be electrically connected to a gate line within the active area. The second trace may include a data signal line, but is not limited thereto, and at this moment, the second trace may be electrically connected to a data signal line within the active area. The third trace may include a resetting signal line or an initializing line, but is not limited thereto, and at this moment, the third trace may be electrically connected to a resetting signal line or initializing line within the active area. Certainly, there may be other cases, which is not discussed further herein.

Referring to FIGS. 24-25, the displaying base plate further includes a buffer layer 102, a gate insulating layer (including a second gate insulating sub-layer 108 and a first gate insulating sub-layer 105) and an inter-layer-medium layer 103 that are arranged sequentially in layer configuration. All of the inter-layer-medium layer, the gate insulating layer and the buffer layer are located within the active area, the trace region, the isolating region, the first-dam region and the transition region. All of the second dam 1c, the third dams 1b, 1a and the isolating pillar 124 are disposed at the side of the inter-layer-medium layer 103 away from the substrate 101.

It should be noted that the structure of the gate insulating layer within the active area and the structure of the gate insulating layer within the non-active area are the same. As an example, if the gate insulating layer within the active area is of a two-layer structure of a first gate insulating sub-layer and a second gate insulating sub-layer, then the gate insulating layer within the non-active area is also of a two-layer structure of a first gate insulating sub-layer and a second gate insulating sub-layer.

In one or more implementations, referring to FIGS. 3 and 4, the displaying base plate further includes a polarizing layer 54, and the polarizing layer 54 is disposed at the side of the touch unit 1 away from the packaging unit 2.

It should be noted that the displaying base plate may further include other components. Merely the components that are relevant to the inventiveness are described herein, and the other components may be obtained by referring to the related art, and are not discussed herein further.

An embodiment of the present application further provides a displaying device, wherein the displaying device includes the displaying base plate stated above.

The displaying device may be a flexible displaying device (also referred to as a flexible screen), and may also be a rigid displaying device (i.e., a displaying device that cannot be bent), which is not limited herein.

The displaying device may be an organic light emitting diode (OLED) displaying device, may also be a Micro LED displaying device or a Mini LED displaying device, and may also include any product or component having a displaying function that includes the displaying device, such as a television set, a digital camera, a mobile phone and a tablet personal computer. The displaying device can greatly ameliorate the problem of greening at the edge of the screen, and has a good effect of displaying and a good user experience.

Optionally, referring to FIGS. 3 and 4, the displaying device further includes a packaging base plate 52, and the packaging base plate 52 and the displaying base plate 50 are fixed together by a binding layer 53.

The packaging base plate may include a glass base plate. The binding layer may include an optically clear adhesive (OCA).

It should be noted that, in order to enable the displaying device to have the functions such as photographing, the displaying device may be integrated with an optical unit. The optical unit may be disposed at the side of the substrate of the displaying base plate away from the driving unit (i.e., the back face of the substrate). In order to better dispose the optical unit, an isolating layer may be disposed between the substrate and the optical unit. Certainly, the displaying device may further include other components, which may be obtained particularly according to the related art, which are not discussed further herein.

The "one embodiment", "an embodiment" or "one or more embodiments" as used herein means that particular features, structures or characteristics described with reference to an embodiment are included in at least one embodiment of the present application. Moreover, it should be noted that here an example using the wording "in an embodiment" does not necessarily refer to the same one embodiment.

The description provided herein describes many concrete details. However, it can be understood that the embodiments of the present application may be implemented without those concrete details. In some of the embodiments, well-known processes, structures and techniques are not described in detail, so as not to affect the understanding of the description.

Finally, it should be noted that the above embodiments are merely intended to explain the technical solutions of the present application, and not to limit them. Although the present application is explained in detail with reference to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present application.

The invention claimed is:

1. A displaying base plate, wherein the displaying base plate comprises an active area and a non-active area connected to the active area, the non-active area comprises an edge region and a first-dam region, and the first-dam region is located between the active area and the edge region;
the displaying base plate further comprises:
a substrate;
an anti-static layer disposed on the substrate, wherein the anti-static layer is located at least within the edge region; and
a driving unit and a touch unit that are disposed on the substrate, wherein the driving unit is located within the active area, and the touch unit is located within the active area and the non-active area, and covers the driving unit; and
the anti-static layer and the touch unit are arranged in a same one layer, or the anti-static layer is disposed at one side of the touch unit away from the substrate;
wherein the touch unit comprises a first touch layer, a first insulating layer, a second touch layer and a second insulating layer that are arranged sequentially in layer configuration on the driving unit; both of the first touch layer and the second touch layer are located within the active area, and the first insulating layer and the second insulating layer are located within the active area and the non-active area; and
one of the first touch layer and the second touch layer is a metal-mesh electrode layer, and the other is a bridging metal layer.

2. The displaying base plate according to claim 1, wherein when the anti-static layer and the touch unit are arranged in a same one layer, the anti-static layer and the first touch layer are arranged in a same one layer; or
when the anti-static layer and the touch unit are arranged in a same one layer, the anti-static layer and the second touch layer are arranged in a same one layer.

3. The displaying base plate according to claim 2, wherein the second insulating layer covers the first insulating layer, and a boundary of the second insulating layer is further from the first-dam region than a boundary of the first insulating layer; and
the second insulating layer located within the non-active area is disposed at one side of the anti-static layer away from the substrate.

4. The displaying base plate according to claim 3, wherein an orthographic projection of the anti-static layer on the substrate and an orthographic projection of the second insulating layer on the substrate partially intersect or overlap; or
an orthographic projection of the anti-static layer on the substrate is located within an orthographic projection of the second insulating layer on the substrate.

5. The displaying base plate according to claim 1, wherein when the anti-static layer is disposed at the one side of the touch unit away from the substrate, the second insulating layer located within the non-active area is disposed at one side of the anti-static layer that is closer to the substrate.

6. The displaying base plate according to claim 1, wherein the first-dam region surrounds the active area, and the edge region surrounds the first-dam region.

7. The displaying base plate according to claim 6, wherein the edge region comprises a cutting-transition region, a crack-dam region and a driving-circuit region; the crack-dam region surrounds the first-dam region, and is broken at the driving-circuit region; and the cutting-transition region surrounds the crack-dam region and the driving-circuit region; and
the crack-dam region comprises one or more slots, and the slots surround the first-dam region, and is broken at the driving-circuit region; and the anti-static layer covers at least some of the slots.

8. The displaying base plate according to claim 7, wherein the displaying base plate further comprises a buffer layer, a gate insulating layer and an inter-layer-medium layer that are arranged sequentially in layer configuration; and all of the inter-layer-medium layer, the gate insulating layer and the buffer layer are located within the active area, the first-dam region and the crack-dam region; and the slots extend throughout at least a part of the inter-layer-medium layer that is located within the crack-dam region.

9. The displaying base plate according to claim 8, wherein the displaying base plate further comprises a first planarization part and a first protrusion, and the first planarization part is located within the cutting-transition region and the crack-dam region; the first protrusion is located within the crack-dam region, surrounds the first-dam region, and is broken at the driving-circuit region; and the first planarization part covers all of the slots, the first protrusion is disposed at one side of the first planarization part away from the substrate, and the anti-static layer covers the first protrusion.

10. The displaying base plate according to claim 9, wherein an edge closer to the cutting-transition region of an entirety formed by the inter-layer-medium layer, the gate insulating layer and the buffer layer has one or more steps; and the first planarization part covers all of the steps.

11. The displaying base plate according to claim 9, wherein the edge region further comprises a crack detecting region, and the crack detecting region is located between the first-dam region and the crack-dam region; and the crack detecting region comprises a plurality of crack detecting lines, and the anti-static layer covers all of the crack detecting lines and all of the slots.

12. The displaying base plate according to claim 11, wherein the anti-static layer is further located within the first-dam region;

the non-active area further comprises a wiring region, and the wiring region is located between the first-dam region and the active area;

the displaying base plate further comprises a power-supply signal line, and the power-supply signal line is located within the wiring region and the first-dam region; and the power-supply signal line and the anti-static layer partially intersect or overlap in a direction perpendicular to the substrate.

13. The displaying base plate according to claim 12, wherein all of the inter-layer-medium layer, the gate insulating layer and the buffer layer are further located within the wiring region and the crack detecting region;

the first-dam region comprises at least one first dam, and the first dam is disposed at one side of the inter-layer-medium layer away from the substrate; the first dam comprises a second protrusion, a second planarization part and a third planarization part that are sequentially arranged;

the second planarization part coats the second protrusion, and the third planarization part coats the second planarization part;

wherein the second protrusion and the first planarization part are arranged in a same one layer, and the second planarization part and the first protrusion are arranged in a same one layer.

14. The displaying base plate according to claim 13, wherein the first-dam region further comprises a jumper wire and a third protrusion, the third protrusion is disposed at one side of the first dam closest to the cutting-transition region that is closer to the crack-dam region, the jumper wire is disposed at the one side of the inter-layer-medium layer away from the substrate, the third protrusion coats the jumper wire, and the third protrusion, the second protrusion and the first planarization part are arranged in a same one layer.

15. The displaying base plate according to claim 14, wherein the power-supply signal line comprises at least a first power line, and the first power line is disposed at the one side of the inter-layer-medium layer away from the substrate; and the first dam is disposed at one side of the first power line away from the substrate;

the first power line and the jumper wire are arranged in a same one layer, and are disconnected from each other, and the third protrusion further coats an edge of the first power line that is closer to the cutting-transition region; and the first power line and the anti-static layer partially intersect or overlap in the direction perpendicular to the substrate.

16. The displaying base plate according to claim 14, wherein the power-supply signal line further comprises a second power line and a third power line; the third power line is disposed at one side of the second power line away from the substrate; and an edge of the second power line that is closer to the cutting-transition region is disposed between the second protrusion and the second planarization part of the first dam closest to the cutting-transition region, and an edge of the third power line that is closer to the cutting-transition region is disposed between the second planarization part and the third planarization part of the first dam closest to the cutting-transition region.

17. The displaying base plate according to claim 16, wherein the displaying base plate further comprises a plurality of light emitting units arranged in an array; and the light emitting units are located within the active area, and are disposed between the driving unit and the touch unit;

each of the light emitting units comprises a first electrode, a luminescent functional layer and a second electrode; and the second electrode is disposed at one side of the luminescent functional layer away from the driving unit;

the driving unit comprises a plurality of transistors arranged in an array, a first planarization film, a plurality of switching electrodes and a second planarization film, the first planarization film covers the transistors, and the switching electrodes are disposed between the first planarization film and the second planarization film, and are electrically connected to the transistors; the first electrode is disposed at one side of the second planarization film away from the substrate, and is electrically connected to one of the switching electrodes;

wherein the first power line is disposed in a same layer as a source and a drain of each of the transistors; the second power line is disposed in a same layer as the switching electrode; the third power line and the first electrode are arranged in a same one layer; the first planarization film, the first planarization part, the second protrusion and the third protrusion are arranged in a same one layer; and the second planarization film, the second planarization part and the first protrusion are arranged in a same one layer.

18. The displaying base plate according to claim 1, wherein the edge region comprises an opening region and a transition region; the transition region surrounds the opening region, and the first-dam region surrounds the transition region; and the anti-static layer is located at least within the transition region.

19. A displaying device, wherein the displaying device comprises the displaying base plate according to claim 1.

\* \* \* \* \*